US011287752B2

(12) United States Patent
Koevoets et al.

(10) Patent No.: US 11,287,752 B2
(45) Date of Patent: Mar. 29, 2022

(54) COOLING APPARATUS AND PLASMA-CLEANING STATION FOR COOLING APPARATUS

(71) Applicant: ASML Netherlands B.V., Veldhoven (NL)

(72) Inventors: Adrianus Hendrik Koevoets, Mierlo (NL); Cornelis Adrianus De Meijere, Eindhoven (NL); Willem Michiel De Rapper, Eindhoven (NL); Sjoerd Nicolaas Lambertus Donders, Vught (NL); Jan Groenewold, Castricum (NL); Alain Louis Claude Leroux, Eindhoven (NL); Maxim Aleksandrovich Nasalevich, Eindhoven (NL); Andrey Nikipelov, Eindhoven (NL); Johannes Adrianus Cornelis Maria Pijnenburg, Moergestel (NL); Jacobus Cornelis Gerardus Van Der Sanden, Geldrop (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/625,135

(22) PCT Filed: Jun. 7, 2018

(86) PCT No.: PCT/EP2018/065032
§ 371 (c)(1),
(2) Date: Dec. 20, 2019

(87) PCT Pub. No.: WO2019/001922
PCT Pub. Date: Jan. 3, 2019

(65) Prior Publication Data
US 2020/0233319 A1    Jul. 23, 2020

(30) Foreign Application Priority Data

Jun. 26, 2017 (EP) .................................. 17177884
Aug. 1, 2017 (EP) .................................. 17184274
Nov. 10, 2017 (EP) .................................. 17201079

(51) Int. Cl.
*G03F 7/20* (2006.01)

(52) U.S. Cl.
CPC ...... *G03F 7/70925* (2013.01); *G03F 7/70875* (2013.01); *G03F 7/70916* (2013.01)

(58) Field of Classification Search
CPC ............. G03F 7/70875; G03F 7/70916; G03F 7/70925
See application file for complete search history.

(56) References Cited

U.S. PATENT DOCUMENTS 6,496,257 B1    12/2002 Taniguchi et al.
6,613,487 B1 *   9/2003 Kim .................... G03F 7/70875
                                                     430/22

(Continued)

FOREIGN PATENT DOCUMENTS

CN         1989458 A      6/2007
CN       102037408 A      4/2011

(Continued)

OTHER PUBLICATIONS

Guillaume Roesch, European International Searching Authority, International Search Report and Written Opinion, counterpart PCT Application No. PCT/EP2018/065032, dated Sep. 21, 2018, 14 pages total.

(Continued)

*Primary Examiner* — Michelle M Iacoletti
(74) *Attorney, Agent, or Firm* — DiBerardino McGovern IP Group LLC

(57) ABSTRACT

A lithographic apparatus comprising a projection system configured to project a patterned radiation beam to form an (Continued)

exposure area on a substrate, a cooling apparatus located in use above the substrate adjacent to the exposure area, the cooling apparatus being configured to remove heat from the substrate during use, a plasma vessel located below the cooling apparatus with its opening facing towards the cooling apparatus, and a gas supply for supplying gas to the plasma vessel and an aperture for receipt of a radiation beam. In use, supplied gas and a received radiation beam react to form a plasma within the plasma vessel that is directed towards a surface of the cooling apparatus which faces the opening of the plasma vessel.

20 Claims, 10 Drawing Sheets

(56) References Cited

U.S. PATENT DOCUMENTS

| | | |
|---|---|---|
| 2002/0112819 A1 | 8/2002 | Kamarehi et al. |
| 2006/0215137 A1 | 9/2006 | Hasegawa et al. |
| 2007/0125964 A1 | 6/2007 | Van Herpen et al. |
| 2009/0014666 A1 | 1/2009 | Zink et al. |
| 2011/0037961 A1 | 2/2011 | Moors et al. |
| 2011/0249245 A1 | 10/2011 | Janssen et al. |
| 2012/0229783 A1 | 9/2012 | Nienhuys et al. |
| 2012/0250144 A1 | 10/2012 | Ehm et al. |
| 2012/0281193 A1 | 11/2012 | Loopstra et al. |
| 2016/0011344 A1* | 1/2016 | Beasley .............. G03F 7/70916 359/360 |

FOREIGN PATENT DOCUMENTS

| | | |
|---|---|---|
| CN | 102579196 A | 7/2012 |
| CN | 102736442 A | 10/2012 |
| DE | 102012107105 A1 | 9/2013 |
| WO | 2016169758 A1 | 10/2016 |

OTHER PUBLICATIONS

Office Action, China National Intellectual Property Administration, counterpart Chinese Patent Application No. 201880055596.1, dated Jan. 4, 2022, 22 pages total (including English translation of 8 pages).

* cited by examiner

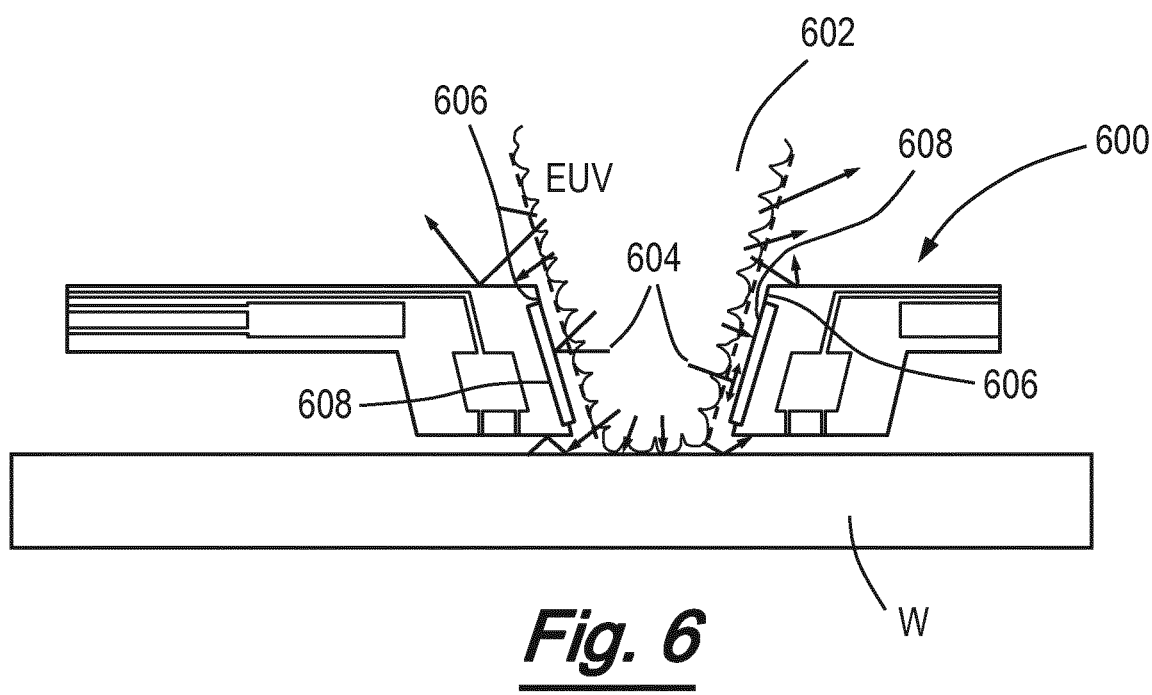
*Fig. 6*
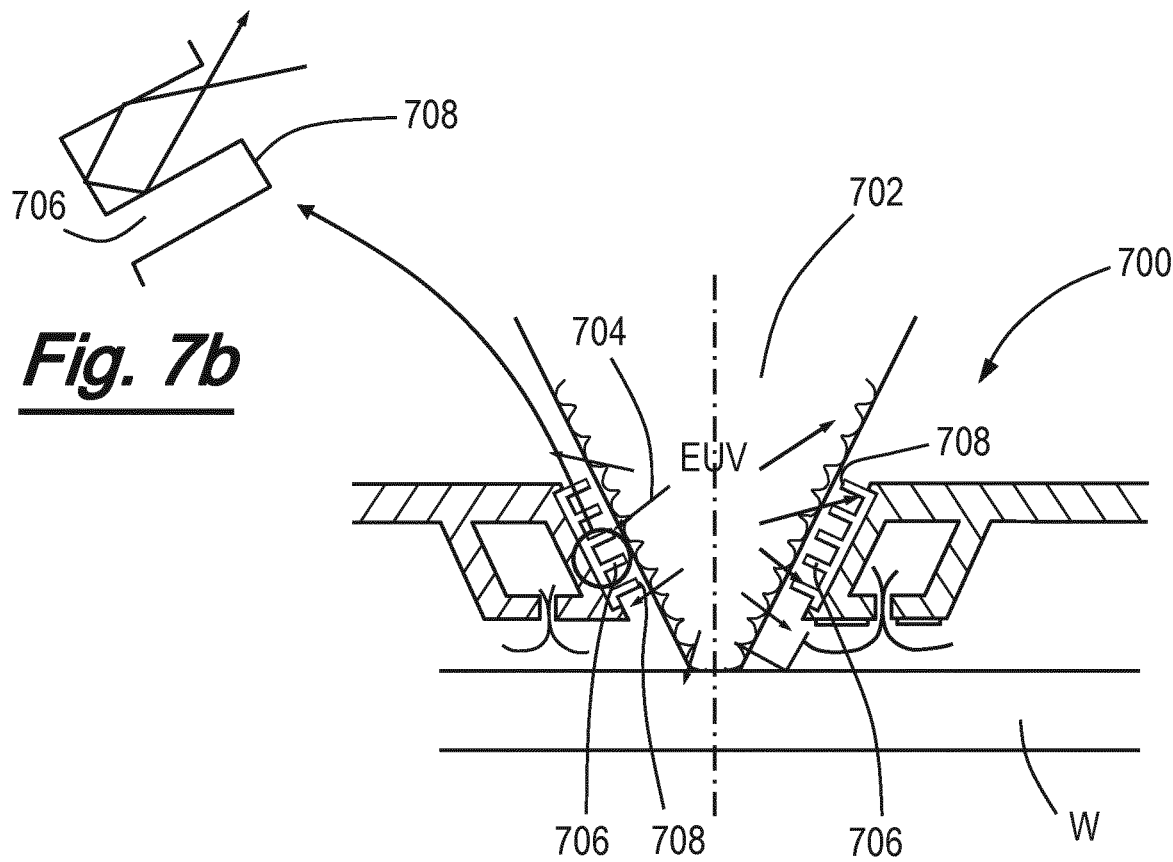
*Fig. 7b*
*Fig. 7a*

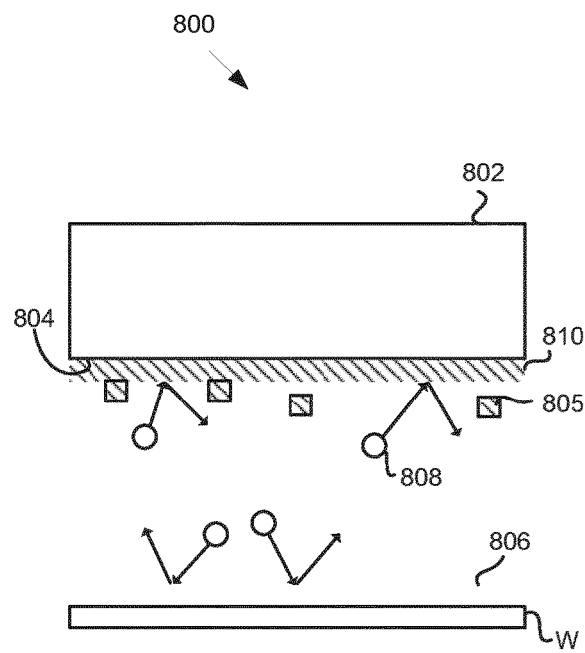
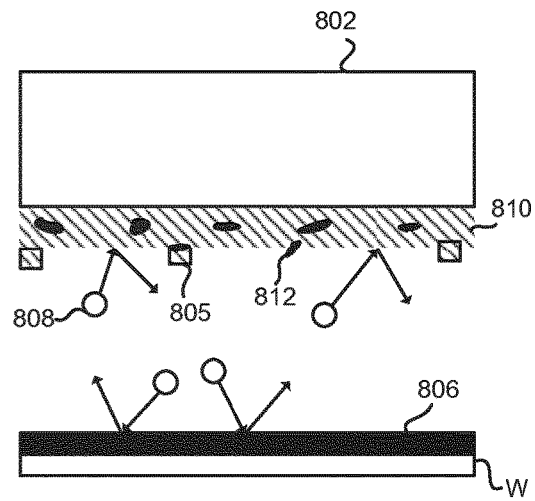
Fig. 8a          Fig. 8b
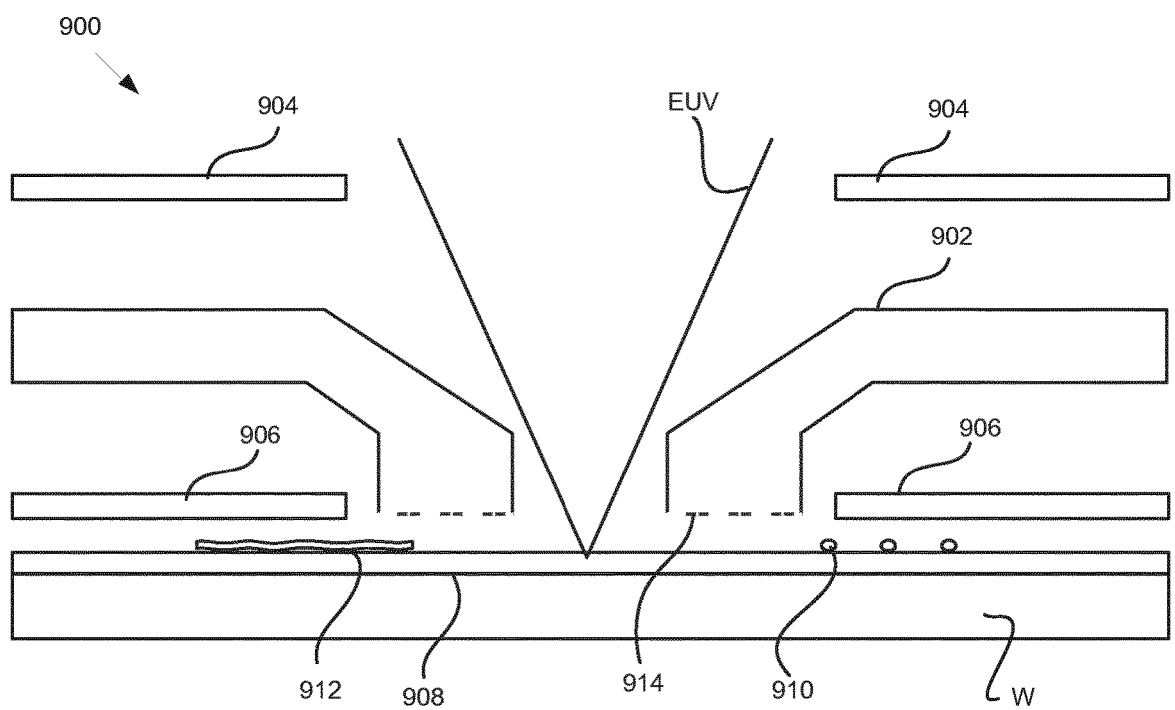
Fig. 9a

COOLING APPARATUS AND PLASMA-CLEANING STATION FOR COOLING APPARATUS

CROSS-REFERENCE TO RELATED APPLICATIONS

This application claims priority of EP applications 17177884.8, which was filed on 26 Jun. 2017, 17184274.3, which was filed on 1 Aug. 2017 and 17201079.5, which was filed on 10 Nov. 2017 and which are incorporated herein in their entirety by reference.

FIELD

The present invention relates to a cooling apparatus for a lithographic apparatus and to a plasma-cleaning station for a cooling apparatus for a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A radiation beam used to project a pattern onto a substrate will deliver a substantial amount of heat to that substrate, and will cause localised heating of the substrate. Localised expansion of the substrate caused by the heating will reduce the accuracy with which a projected pattern overlies patterns already present on the substrate.

In order to locally suppress heating in a substrate area close to the exposure area, a cooling apparatus is provided in the lithographic apparatus. The cooling apparatus operates at a very low temperature (around −60° C.). Owing to the low operating temperature of the cooling apparatus, it is prone to catching some resist outgassing species, such as $SnH_4$ and hydrocarbons. As the surface of the cooling apparatus which faces towards the substrate becomes contaminated with hydrocarbons, the thermal accommodation coefficient (TAC) will begin to change. This results in a drift in heat transfer and hence changes in the wafer heating overlay.

SUMMARY

It may be desirable to provide a lithographic apparatus which addresses the problem identified above or some other problem associated with the prior art.

In accordance with one embodiment of the invention, provision is made of a lithographic apparatus comprising: a projection system configured to project a patterned radiation beam to form an exposure area on a substrate; a cooling apparatus located in use above the substrate adjacent to the exposure area, the cooling apparatus being configured to remove heat from the substrate during use; a plasma vessel located below the cooling apparatus with its opening facing towards the cooling apparatus; and a gas supply for supplying gas to the plasma vessel and an aperture for receipt of a radiation beam, wherein in use supplied gas and a received radiation beam react to form a plasma within the plasma vessel that is directed towards a surface of the cooling apparatus which faces the opening of the plasma vessel.

In this way it is possible to clean the hydrocarbons from the surface of the cooling hood much more quickly and effectively than has previously been achievable.

In some embodiments, the gas is supplied from the cooling apparatus. However, in other embodiments, the gas may additionally or alternatively be supplied from a dynamic gas lock. This avoids the need to provide a separate gas supply if the gas supplied is $H_2$, since this is already present in the dynamic gas lock which forms part of the lithographic apparatus.

In some embodiments, in use the pressure in the plasma vessel is between 10 and 10 000 Pa, preferably between 20 and 200 Pa, and more preferably is 100 Pa. The higher the pressure in the plasma vessel, the more quickly the surface of the cooling apparatus can be cleaned.

In accordance with another aspect of the invention, provision is made of a plasma vessel for use in a lithographic apparatus.

In some embodiments, the plasma vessel comprises a reflector for reflecting radiation within the plasma vessel. In some embodiments, the reflector comprises a pyramid structure within a base of the plasma vessel. The reflector enables the radiation received in the plasma vessel to be reflected within the plasma vessel. A plasma is created from the combination of the supplied gas and the EUV radiation. The hydrocarbon contaminants on the surface of the cooling apparatus which is to be cleaned are then plasma-etched from the surface.

In some embodiments, the plasma vessel comprises an absorber for absorbing radiation that has been reflected within the plasma vessel to prevent radiation generated by the plasma being incident on the cooling apparatus. This avoids carbonisation occurring on the surface of the cooling apparatus.

In some embodiments, the plasma vessel comprises an additional reflector located in the vicinity of the absorber, which additional reflector reflects radiation incident thereon back towards the centre of the plasma vessel. This results in the absorption of the radiation being twice as great as in the case where only the absorber is present. In such embodiments, at least part of the wall of the plasma vessel which comprises the absorber and the additional reflector should be angled towards the centre of the plasma vessel in order to avoid the radiation becoming incident on the surface of the cooling apparatus. This avoids carbonisation occurring on the surface.

In some embodiments, the plasma vessel comprises a restriction means located at its opening, which restriction means permits the radiation beam to pass while preventing the passage of the gas out of the plasma vessel. This improves the efficiency of the plasma generation.

The lithographic apparatus may further comprise a trapping agent delivery system, for providing a trapping agent to an area between a cooling surface of the cooling apparatus and the substrate, wherein the trapping agent is configured to form a trapping layer on the cooling surface during use of the lithographic apparatus.

Another aspect of the invention relates to a cooling system for use in a lithographic apparatus. In accordance with an embodiment, there is provided a cooling system for use in a lithographic apparatus. The cooling system comprises a cooling fluid source for supplying a cooling fluid, a cooling apparatus for cooling the lithographic apparatus, the cooling apparatus being fluidically connected downstream of the cooling fluid source, and a restriction within the cross-sectional area of the fluidic connection between the cooling fluid source and the cooling apparatus. The restriction effects a reduction in pressure of the cooling fluid thereby to cause a local reduction in temperature in the vicinity of the cooling apparatus.

This aspect provides a cooling system that is able to provide localised cooling within the vicinity of the cooling apparatus. The cooling apparatus may be positioned, for example, in the vicinity of a substrate that is to be patterned, so that the cooling apparatus can remove heat from the substrate generated by radiation directed at the substrate.

The cooling system may further comprise a flow control unit fluidically connected downstream of the cooling fluid source and arranged to maintain a substantially constant flowrate through the restriction.

The cooling system may further comprise a superheater fluidically connected downstream of the cooling apparatus and arranged to evaporate cooling fluid downstream of the cooling hood.

The cooling system may further comprise a controller connected between the superheater and the flow control unit, the controller arranged to control the flow control unit based upon operation of the superheater. In this way, control is provided over the amount of coolant fluid that is used. For example, where the superheater is operating to evaporate a large amount of coolant, this may indicate that too much coolant is being provided to the cooling apparatus. The controller may therefore control the flow control unit to cause a reduction in the amount of coolant that flows to the cooling apparatus.

The cooling system may further comprise a collection vessel fluidically connected downstream of the cooling apparatus and adapted to collect the cooling fluid. The cooling vessel may provide capacity within the cooling system to store cooling fluid that has been used to cool the cooling apparatus.

The cooling system may further comprise a pressure control unit fluidically connected downstream of the collection vessel and operable to control a pressure of the cooling fluid within the collection vessel and to maintain a reduced pressure of the cooling fluid downstream of the restriction.

The cooling system may further comprise an exhaust fluidically connected downstream of the collection vessel in order to allow the cooling fluid to exit the cooling system.

The cooling system may further comprise a compressor fluidically connected downstream of the collection vessel. The compressor may be adapted to compress the cooling fluid for return to the cooling fluid source to be resupplied to the cooling system. In this way, the coolant can be recirculated through the cooling system.

The cooling system may further comprise a heat exchanger fluidically connected between the compressor and the cooling fluid source and arranged to condition the cooling fluid temperature before it is returned to the cooling fluid source.

The cooling fluid may be any of $N_2O$, $CO_2$, ethylene or methylene.

The drop in pressure effected by the reduction in cross-sectional area of the fluidic connection between the flow control unit and the cooling apparatus may be approximately 50 bar (5 MPa).

The cooling system may further comprise a heat exchanger fluidically connected between the cooling fluid source and the restriction and adapted to condition the cooling fluid to a desired temperature prior to expansion by the restriction.

In accordance with another aspect described herein, there is provided a lithographic apparatus comprising a projection system configured to project a patterned radiation beam to form an exposure area on a substrate, the lithographic apparatus further comprising a cooling system according to any one of the above described aspects.

In accordance with another aspect described herein, there is provided a lithographic apparatus comprising a projection system configured to project a patterned radiation beam to form an exposure area on a substrate; a cooling apparatus located in use above the substrate adjacent to the exposure area, the cooling apparatus being configured to remove heat from the substrate during use; a gas supply for supplying gas to an area above the substrate and an aperture for receipt of a radiation beam wherein in use supplied gas and a received radiation beam react to form a plasma in the area above the substrate; wherein the cooling apparatus has at least one surface comprising a material selected to increase a radical recombination probability. For example, the material selected to increase a radical recombination probability may have a high radical recombination probability which is at least 10%, preferably at least 15%. The material selected to increase the radical recombination probability may be in form of a coating on a surface comprising material with a radical recombination probability lower than 10%, or it may be a construction (bulk) material of the cooling apparatus itself with a radical recombination probability of at least 10%, preferably at least 15%.

In other words, the material makes it more likely that highly reactive plasma radicals incident on the surface will recombine to form inert molecules. The material may catalyze the recombination reaction. In particular, the material increases the chance that a first radical temporarily in contact with the surface provided with the material will recombine with one or more further radicals to form an inert molecule when the one or more further radicals collide with the first radical or with the surface in the vicinity of the first radical. In this way, excessive wear of surfaces of the cooling apparatus may be avoided.

In some embodiments, the at least one surface comprises a structure comprising opposing surfaces to facilitate internal deflection of radicals. For example, the structure may comprise a generally ribbed portion. Alternatively or in addition, the structure may comprise a generally honeycomb-like portion. In this way, the wall has a larger surface area and the recombination probability may be increased.

In some embodiments, the at least one surface comprises a coating applied to at least part of the cooling apparatus. The coating may be provided on at least one wall of the aperture for receipt of the radiation beam. In this way, the aperture which receives the radiation beam may be protected from excessive wear caused by the generated plasma. The coating may comprise any of nickel (Ni), iron (Fe), chromium (Cr) or cobalt (Co), or a combination of any thereof. These have been shown to increase the radical recombination rate. In particular, the coating may comprise nickel. It has been shown that nickel facilitates a particularly high radical-recombination rate and is particularly suitable for use within the lithographic apparatus. In this way, the plasma may be recombined into an inert form more quickly and thus excessive wear may be minimised.

In accordance with another aspect described herein, there is provided a lithographic apparatus comprising a projection system configured to project a patterned radiation beam to form an exposure area on a substrate and a cooling apparatus. The cooling apparatus comprises a cooling element. The cooling element comprises a cooling surface, wherein in use the cooling element is located above the substrate adjacent to the exposure area. By above the substrate, it is meant that the cooling element is before the substrate in the direction of propagation of the patterned radiation beam. In use, the cooling surface opposes the substrate. The cooling apparatus further comprises a trapping agent delivery system for providing a trapping agent to an area between the cooling surface and the substrate, wherein the trapping agent is configured to form a trapping layer on the cooling surface during use of the lithographic apparatus. The trapping layer may trap outgassing species from the substrate.

In this way, it is the trapping layer, not a layer of outgassed material that is exposed to the substrate. In this way, the thermal accommodation coefficient of the surface that is exposed to the substrate may remain constant. Put another way, the trapping layer becomes the cooling surface.

The trapping agent delivery system may be configured to provide the trapping agent at a rate sufficient to cause the trapping layer to grow at a rate greater than a rate at which a contamination layer grows on the cooling surface.

The cooling apparatus may further comprise a cooling gas delivery conduit configured to deliver a cooling gas to the area between the cooling surface and the substrate.

The trapping agent delivery system may be configured to provide the trapping agent as a vapour which condenses and/or freezes on the cooling surface. The trapping agent delivery system and the cooling gas delivery system may be the same delivery system or may be different delivery systems.

The partial pressure of the trapping agent in the area between the cooling surface and the substrate may be less than the partial pressure of the cooling gas.

The cooling apparatus may further comprise a thermal shield located between a first portion of the cooling element and the substrate, so as to reduce an amount of heat that is removed from the substrate by the first portion. The trapping agent delivery system may be arranged to deliver the trapping agent in a solid, liquid and/or gas state to a portion of the thermal shield from which the trapping agent The trapping agent delivery system may be arranged to provide the trapping agent in liquid form on the substrate. For example, the trapping agent may be provided in a liquid film or in droplets on the substrate. For example, the trapping agent may be provided with scribe lanes of the substrate.

The trapping agent delivery system may be arranged to provide a precursor to an area adjacent the substrate, such that in use the precursor reacts with molecules present in the area adjacent the substrate to produce the trapping agent. For example, the trapping agent delivery system may be arranged to provide oxygen to an area adjacent the substrate. The oxygen may react with hydrogen ions/radicals created within the vicinity of the radiation beam to produce the trapping agent.

The cooling apparatus may further comprising a modifying agent delivery system, wherein the modifying agent is configured to disorient the trapping layers the trapping layer forms on the cooling surface.

The cooling element may be configured to be cooled in use to a temperature above −110 degrees C. and modifying agent comprises ethanol. In this way, dry ethanol may be provided together with the cooling gas and/or the trapping agent within the same delivery system.

A wetting promoting coating may be provided on the cooling surface. For example, known coatings which are variously known as hydrophilic, icephylic, wetting, superwetting, etc. may be used.

The trapping agent may comprise $H_2O$.

The trapping layer may comprise ice and/or a liquid $H_2O$ film.

The lithographic apparatus may further comprising one or more heating elements disposed on or in the vicinity of the cooling surface and configured to selectively heat an area of the cooling surface. In this way, a localized area of the cooling surface may be rapidly heated and cooled without heating the entire cooling surface or indeed the entire cooling element. The area may be an area on which outgassing materials condense and/or freeze. In this way, by locally heating the area of the cooling surface, the outgassed materials can be removed (e.g. through melting) from the cooling surface. Additionally, where a trapping layer is formed, selectively heating an area of the cooling surface allows for rapid and efficient removal of the trapping layer.

According to another aspect described herein, there is provided a projection system configured to project a patterned radiation beam to form an exposure area on a substrate and a cooling apparatus. The cooling apparatus comprises a cooling element comprising a cooling surface, wherein in use the cooling element is located above the substrate adjacent to the exposure area, the cooling surface opposing the substrate, one or more heating elements disposed on or in the vicinity of the cooling surface and configured to selectively heat an area of the cooling surface.

According to another aspect described herein, there is provided a cooling system for cooling a substrate to be patterned by a lithographic apparatus. The cooling system comprises a cooling element for cooling the lithographic apparatus, the cooling element comprising a cooling surface, wherein in use the cooling surface opposes a substrate to be patterned by the lithographic apparatus, and a trapping agent delivery system, for providing in use a trapping agent to an area between the cooling surface and the substrate, wherein the trapping agent is configured to form a trapping layer on the cooling surface during use of the lithographic apparatus.

In accordance with another aspect described herein, there is provided a lithographic apparatus comprising a projection system configured to project a patterned radiation beam to form an exposure area on a substrate and a cooling apparatus. The cooling apparatus comprises a cooling element. The cooling element comprises a cooling surface, wherein in use the cooling element is located above the substrate adjacent the exposure area. By above the substrate, it is meant that the cooling element is before the substrate in the direction of propagation of the patterned radiation beam. In use, the cooling surface opposes the substrate. The cooling apparatus further comprises at least one surface comprising a self-cleaning material.

In this way, the outgassed materials from the substrate (e.g. from a resist layer on the substrate) which condense or otherwise adsorb on the cooling surface are able to be removed readily. As such, the amount of outgassed material which is condensed or adsorbed on the cooling surface is controlled and the thermal accommodation coefficient of the cooling surface that is exposed to the substrate may remain substantially constant.

Any suitable self-cleaning material may be used. A self-cleaning material is one which has the inherent ability to remove or destroy contaminants on its surface. The self-cleaning property may be a result of the material having a low affinity for the contaminants to which it is exposed, a result of the material acting to chemically alter the contaminants to make the contaminants to adsorb less readily and/or desorb more readily, or a combination thereof. The self-cleaning surface may promote conversion of outgassing molecules to molecules which are more volatile than the outgassing molecules such that the more volatile molecules are less prone to deposition on the cooling surface. For example, long-chain hydrocarbons may be converted into shorter chain hydrocarbons, or may be converted to, for example, carbon monoxide, carbon dioxide, or water.

In one aspect described herein, the self-cleaning material comprises a catalytic material. The catalytic material may catalyze oxidation and/or reduction reactions. The oxidation and/or reduction reactions preferably convert the outgassing molecules into more volatile molecules.

For example, the catalytic material may catalyze hydrogenation and/or hydrogenolysis reactions. The major outgassing materials comprise hydrocarbons. Such hydrocarbons may be partially oxidized and/or may be unsaturated. Hydrogenation and/or hydrogenolysis of the outgassing materials increases the volatility of such materials, which promotes cleaning of the cooling surface at normal operating temperatures of, for example around −100° C. to around −50° C. In addition, where the cooling surface is heated up to higher than its normal operating temperature, such as to ambient temperatures, the condensed outgassing material will more readily be released from the cooling surface as a result of the hydrogenation and/or hydrogenolysis.

The hydrogenation and/or hydrolysis is effected by activated hydrogenous species, such as, for example, $H+$, $H_3+$, and hydrogen free radicals ($H*$). Since hydrogen is used as a cooling or bearing gas, when such hydrogen is irradiated by the radiation beam, this generates the activated hydrogenous species. The presence of the catalytic material onto which the outgassing material is adsorbed provides a reaction pathway with a lower activation energy compared to a non-catalytic material, thereby allowing the reaction to proceed more quickly. As such, despite the low temperature of the cooling surface, the highly reactive hydrogen species are able to react with the outgassing material and thereby increase the volatility of the material adsorbed onto the cooling surface. Thus, it is possible to decrease the amount of material which is adsorbed on the cooling surface. The cleaning of the cooling surface may take place during operation of the lithographic apparatus or may take place during a dedicated cleaning phase.

The lithographic apparatus may comprise means for moving the substrate away from the focal plane of the radiation beam. In this way, the radiation beam acts as a diffuse source of the activated hydrogenous species and the amount of activated hydrogenous species is increased in comparison to the case where the substrate is in the focal plane of the radiation beam. It will be appreciated that moving the substrate away from the focal plane of the radiation beam would take place when imaging was not occurring as the radiation would not be sufficiently focused to be able to provide the extremely fine detail required.

Alternatively or additionally, the apparatus may comprise a source of active species. The source of active species may be, for example, a plasma source or a hydrogen radical source. The source of active species may be located at any suitable position, but is preferably located in the vicinity of the cooling surface. The source of active species may be any suitable source, for example an ECR (Electron Cyclotron Resonance) source. The source of active species is able to generate activated hydrogenous species, which are then able to pass to the cooling surface and react with any outgassing species adsorbed thereto. The source of active species may be operated when the lithographic apparatus is in operation and/or may be operated during a dedicated cleaning phase. The source of active species may be in continuous or intermittent operation depending on the extent of activated species required.

The catalytic material may comprise, for example, rhodium, ruthenium, palladium, platinum, silver, osmium, iridium, gold, and/or nickel. The catalytic material may comprise additional elements. The catalytic material may be an alloy or may be doped with one or more additional elements in order to modify its activity.

The catalytic material may catalyze oxidation reactions. Where the cooling surface is cleaned by oxidation, the lithographic apparatus may further comprise an oxidizing agent source. In this way, the catalytic material will promote the conversion of the outgassing material, which is primarily hydrocarbons, to more volatile species, such as, for example, carbon monoxide, carbon dioxide, water, as well as partially oxidized hydrocarbons, such as alcohols or ethers. Such reaction products may be sufficiently volatile to desorb from the cooling surface at normal operating temperatures, or at least be more readily removed when the cooling surface is heated to ambient temperatures.

The oxidizing agent may be any suitable oxidizing agent. For example, the oxidizing agent may be oxygen, ozone, air, hydrogen peroxide, or water vapour. As with the case where activated oxygenous species are used to clean the cooling surface, the oxidizing agent is preferably activated by exposure to the radiation beam. The radiation beam may be an EUV beam. Thus, when exposed to the radiation beam, the oxidizing agent is activated and converted to more reactive species, such as oxygen free radicals. The presence of the catalytic material onto which the outgassing material is adsorbed provides a reaction pathway with a lower activation energy compared to a non-catalytic material, thereby allowing the reaction to proceed more quickly. As such, despite the low temperature of the cooling surface, the highly reactive oxygen species are able to react with the outgassing material and thereby increase the volatility of the material adsorbed onto the cooling surface. Thus, it is possible to decrease the amount of outgassing material which is adsorbed on the cooling surface. The cleaning of the cooling surface may take place during operation of the lithographic apparatus or may take place during a dedicated cleaning phase.

The lithographic apparatus may comprise means for moving the substrate away from the focal plane of the radiation beam. In this way, the radiation beam acts as a diffuse source of the activated oxygen species and the amount of activated oxygen species is increased in comparison to the case where the substrate is in the focal plane of the radiation beam. It will be appreciated that moving the substrate away from the focal plane of the radiation beam would take place when imaging was not occurring as the radiation would not be sufficiently focused to be able to provide the extremely fine detail required.

Alternatively or additionally, the apparatus may comprise a source of active species, such as a plasma source or a hydrogen radical source. The source of active species may be located at any suitable position, but is preferably located in the vicinity of the cooling surface. The source of active species can be any suitable source, for example an ECR (Electron Cyclotron Resonance) source. The source of active species is able to generate activated oxygen species, which are then able to pass to the cooling surface and react with any outgassing species adsorbed thereto. The source of active species may be activated when the lithographic apparatus is in operation and/or may be activated during a dedicated cleaning phase. The source of active species may be in continuous or intermittent operation depending on the extent of activated oxygen species required.

The catalytic material may comprise any suitable material. The catalytic material may comprise metal or metal oxides. The metal may comprise, for example, titanium, zirconium, zinc, ruthenium, platinum, palladium, rhodium, iron, cobalt, vanadium, copper, nickel, manganese, and/or oxides thereof. The catalytic material may comprise mixtures of metals and/or metal oxides.

In an embodiment, the oxidizing agent may be provided on a substrate. Preferably the substrate is a non-product wafer. The oxidizing agent may be provided as a coating, such as a mist or a film, or may be added to the atmosphere surrounding the cooling surface. For example, where the oxidizing agent is hydrogen peroxide, the hydrogen peroxide can be added as a vapour which may condense on the cooling surface and/or the substrate. When the hydrogen peroxide is exposed to the radiation beam, it will begin to decompose. The decomposition is exothermic and will catalyze the decomposition of further amounts of the hydrogen peroxide. The decomposition will generate highly reactive oxygen species which will react with outgassing material adsorbed on the cooling surface and will also locally increase the temperature of the cooling surface, further promoting release of any adsorbed outgassing material.

The catalytic material may catalyze the decomposition of hydrogen peroxide. The catalytic material may comprise zirconium, titanium, yttrium, iron, copper, cerium, gadolinium, hafnium, uranium, and/or oxides thereof.

In an aspect, the self-cleaning material may be hydrophobic and/or lipophobic. Since the majority of the outgassing materials are hydrocarbons, the self-cleaning material, preferably has a low affinity for hydrocarbons, i.e. is lipophobic. Preferably, the self-cleaning material has a low affinity for the products of oxidation or reduction of hydrocarbons. In this way, the amount of outgassing material which becomes adsorbed to the cooling surface is reduced.

Any material which has a low affinity for adsorption may be used. Preferably, the surface comprises gold, silver, platinum, palladium, iridium, rhodium, osmium, ruthenium, cobalt, nickel, titanium, and oxides thereof.

It will be appreciated that certain materials provide a number of self-cleaning mechanisms as identified above. For example, platinum and palladium can serve to catalyze hydrogenolysis reactions, oxidation reactions, and also have a very low affinity for hydrocarbons. In addition, the source of active species may be able to produce activated hydrogenous species and activated oxygen species, such as free radicals.

According to another aspect described herein, there is provided a projection system configured to project a patterned radiation beam to form an exposure area on a substrate and a cooling apparatus. The cooling apparatus comprises a cooling element comprising a cooling surface, wherein in use the cooling element is located above the substrate adjacent to the exposure area, the cooing surface opposing the substrate, wherein the cooling surface comprises a self-cleaning material.

According to another aspect described herein, there is provided a cooling system for cooling a substrate to be patterned by a lithographic apparatus. The cooling system comprises a cooling element for cooling the lithographic apparatus, the cooling element comprising a cooling surface, wherein in use the cooling surface opposes substrate to be patterned by the lithographic apparatus, wherein the cooling surface comprises a self-cleaning material.

According to a further aspect described herein, there is provided a method of cleaning a cooling system of a lithographic apparatus, said method comprising providing at least one surface comprising a self-cleaning material. The self-cleaning material can be any material described above in respect of any aspect of the present invention.

The method may comprise introducing an oxidizing agent into the lithographic constantly or periodically. The oxidizing agent may be introduced when the lithographic apparatus is in use irradiating wafers or may be introduced during a specific cleaning cycle in which wafers are not being manufactured.

The oxidizing agent may comprise any of oxygen, air, water vapour, hydrogen peroxide, ozone, hydroxide radicals, oxygen radicals, or combinations thereof. Nitrogen gas may also be provided alongside the oxidizing agent. The oxidizing agent may be activated by any suitable means, such as, for example, absorption of electromagnetic radiation or by ionization. The electromagnetic radiation may be the EUV used by the lithographic apparatus. The ionization may be effected by any suitable means, such as electronic discharge and may generate a plasma. By activation, it is meant that the oxidizing agent is converted to a more reactive species, for example a free radical or an ion.

In a method, the oxidizing agent is generated away from the at least one surface comprising a self-cleaning material and introduced when the lithographic apparatus is not in use patterning wafers. The oxidizing agent, preferably hydrogen peroxide, may be provided on a non-imaging wafer, and the non-imaging wafer may be passed through a radiation beam of the lithographic apparatus to promote release of the oxidizing agent in the vicinity of the at least one cooling surface. In this way, as the non-imaging wafer is passed through the EUV radiation beam, it is heated and this heating promotes the release of the oxidizing agent. The oxidizing agent is therefore released in the vicinity of the cooling surface onto which the majority of outgassing material is adsorbed.

According to a further aspect described herein, there is provided the use of a non-imaging wafer comprising an oxidizing agent in a method as described above. The use of a non-imaging wafer to provide the source of the oxidizing agent provides a convenient way of introducing the oxidizing agent into the lithographic apparatus. It also ensures that the oxidizing agent is provided near to the areas of the lithographic apparatus which require the most cleaning.

According to a further aspect described herein, there is provided a cooling apparatus for a lithographic apparatus, wherein at least one surface of said cooling apparatus is coated with a self-cleaning material. As described above, the self-cleaning material serves to promote cleaning of the cooling apparatus, which tends to become contaminated with outgassing materials.

Features described in the context of one aspect or embodiment described above may be used with others of the aspects or embodiments described above.

BRIEF DESCRIPTION OF THE DRAWINGS

Embodiments of the invention will now be described, by way of example only, with reference to the accompanying schematic drawings, in which:

FIG. 6 depicts a lateral sectional view of another cooling apparatus for a lithographic apparatus according to the invention, FIG. 7a depicts a lateral sectional view of another embodiment of a cooling apparatus for a lithographic apparatus according to the invention;

FIG. 7b depicts a detail view of a part of FIG. 7a;

FIG. 8a depicts the formation of a trapping layer on a cooling surface of a cooling element;

FIG. 8b depicts trapping of outgassed molecules within the trapping layer of FIG. 8a;

FIG. 9a depicts a cooling apparatus in which a trapping agent is provided in liquid form on a substrate;

DETAILED DESCRIPTION

Figure 1:
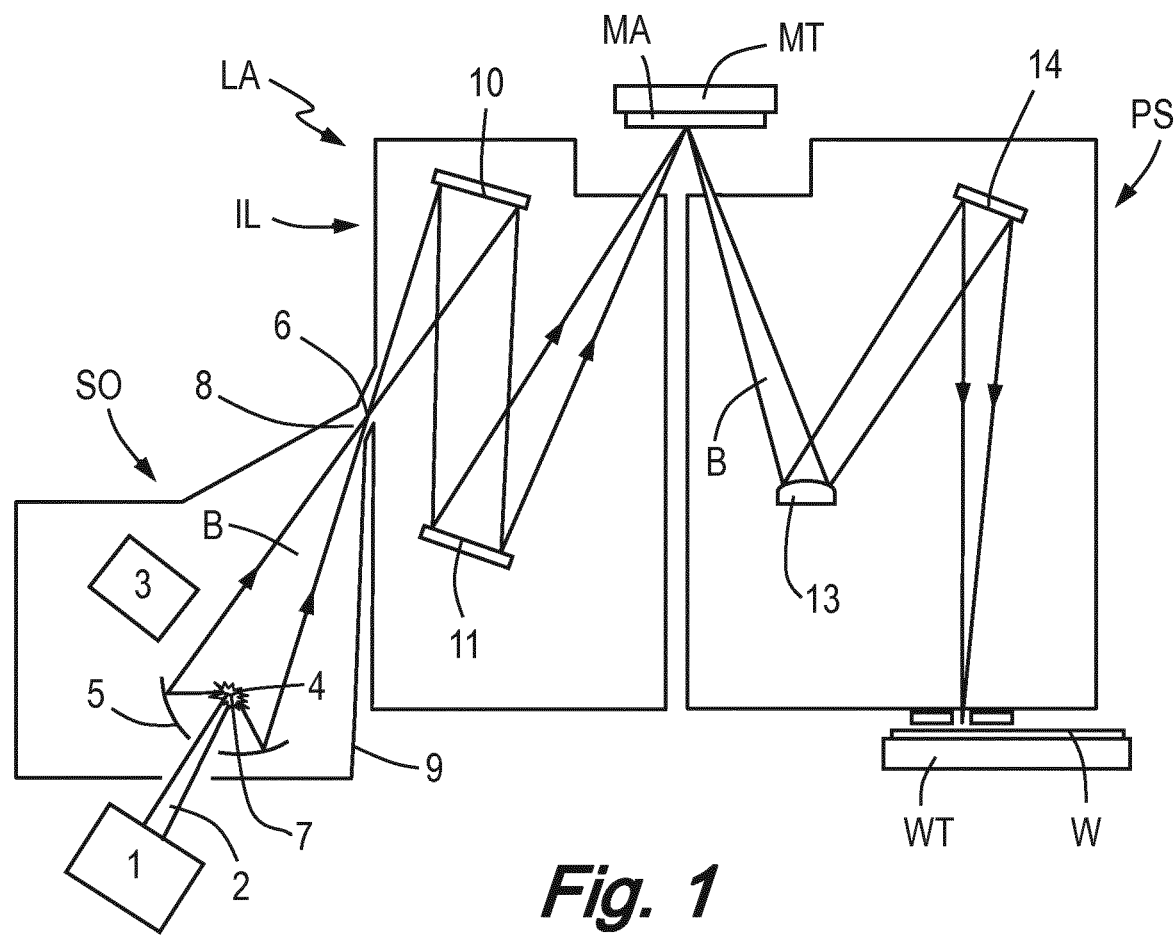
FIG. 1 depicts a lithographic system suitable for use with an embodiment of the invention.

The features and advantages of the present invention will become more apparent from the detailed description set forth below when taken in conjunction with the drawings. In the drawings, like reference numbers generally indicate identical, functionally similar, and/or structurally similar elements.

This specification discloses one or more embodiments that incorporate the features of this invention. The disclosed embodiment(s) merely exemplify the invention. The scope of the invention is not limited to the disclosed embodiment(s). The invention is defined by the claims appended hereto.

FIG. 1 shows a lithographic system suitable for use with an embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in the illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam B. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 1, the projection system may include any number of mirrors (e.g. six mirrors).

A cooling apparatus 200 is located above the substrate W. The cooling apparatus 200 provides localised cooling of the substrate in the vicinity of the radiation beam B.

The radiation sources SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

Figure 2:
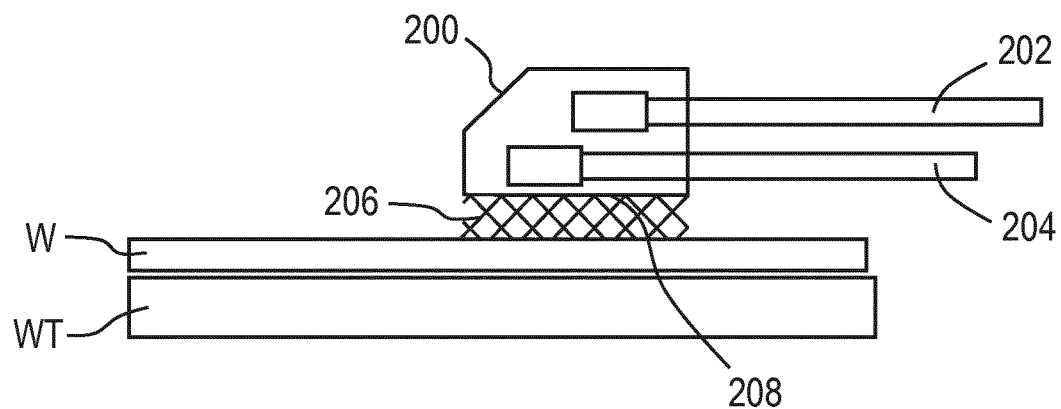
FIG. 2 depicts a lateral sectional view of a cooling apparatus for a lithographic apparatus according to the invention.

FIG. 2 shows a lateral sectional view of a cooling apparatus 200 for a lithographic apparatus according to the invention. The cooling apparatus 200 comprises a cooling system which comprises a supply line 202 and a return line 204. The supply line 202 supplies cooling fluid to the cooling apparatus 200 and the return line 204 transports the fluid away from the cooling apparatus 200 after heat transfer has occurred.

As described above with reference to FIG. 1, the cooling apparatus 200 is located above a substrate W held by a substrate table WT. The area between the bottom surface 208 (or cooling surface) of the cooling apparatus 200 and the surface of the substrate W is pressurised to facilitate heat transfer from the substrate W to the cooling apparatus 200. For this purpose, the cooling apparatus 200 may comprise a gas source and a gas outlet which allows a gas, such as Hz, for example, to be pumped into the space between the cooling apparatus 200 and the substrate W. The gas provided into the space between the cooling apparatus 200 and the substrate W may be referred to as a cooling gas (or bearing gas).

Figure 3:
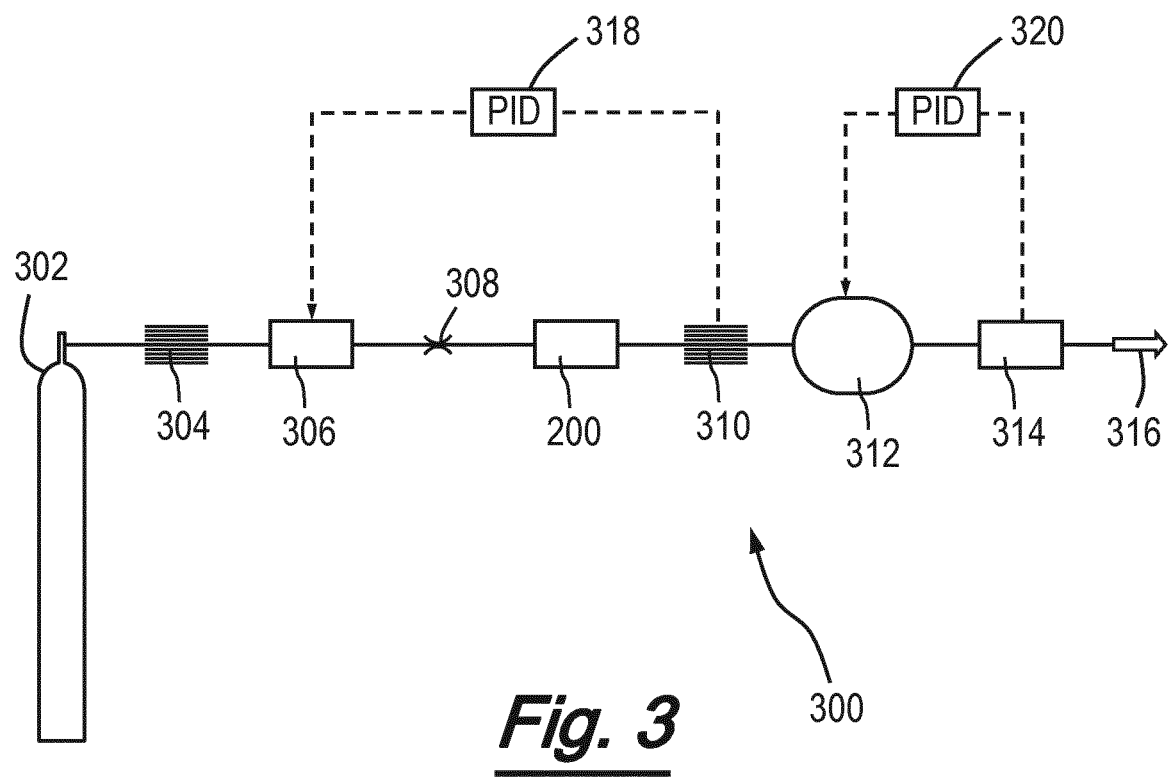
FIG. 3 depicts an example of a cooling system for use with a cooling apparatus for a lithographic apparatus according to the invention.

FIG. 3 shows an example of a cooling system 300 for use with a cooling apparatus 200 for a lithographic apparatus according to the invention. The cooling system 300 comprises a cooling fluid source 302 which is fluidically connected to a heat exchanger 304. In an embodiment, the initial pressure of the cooling fluid in the supply line may be, for example, approximately 52 bar (5.2 MPa). In an embodiment, the heat exchanger 304 may maintain the temperature of the cooling fluid at approximately 22° C.

The heat exchanger 304 is fluidically connected to a downstream flow controller 306. The flow controller 306 ensures that the cooling fluid flows through the supply line at a constant rate, for example of approximately 0.15 g/s. The flow controller 306 is controlled by means of PID control 318 in order to ensure that the target flowrate is maintained.

Downstream of the flow controller 306, the cooling fluid passes through a restriction 308 in the supply line, where the cross-sectional area of the fluid supply line is reduced. This results in a significant pressure reduction, for example of approximately 50 bar (5 MPa) such that, for the length of the restriction, the cooling fluid is under a pressure of approximately 2 bar (0.2 MPa). Further downstream, the cross-sectional area of the fluid supply line is increased again. The pressure of the fluid downstream of the restriction is controlled by a pressure controller 314. The reduction in pressure lowers the saturation temperature resulting in flash evaporation of the cooling fluid, thereby cooling the system to the saturation temperature set by the pressure. In the described embodiment, flash evaporation may occur at a temperature in the range from approximately −55° C. to approximately −80° C. The evaporation takes place inside a cooling apparatus 200 located close to the part of the lithography apparatus where cooling is desired.

A superheater 310 is connected downstream of the cooling apparatus 200. The superheater 310 increases the temperature of the fluid (for example back to 22° C.), evaporating any fluid which was not yet in gaseous form. The PID control 318 of the upstream flow controller 306 is linked to the superheater 310 such that fluid usage is minimised.

A vessel 312 is connected between the superheater 310 and the pressure controller 314. The vessel 312 collects the cooling fluid. The vessel 312 may store the spent cooling fluid at a set pressure, thereby regulating the back-pressure in the cooling system. The pressure maintained within the vessel may be controlled by a PID control 320. It will be appreciated that both the PID control 318 and PID control 320 may be replaced by other controllers.

In the example shown in FIG. 3, an exhaust 316 is provided downstream of the pressure controller. The exhaust 316 allows cooling fluid to exit the cooling system 300.

Figure 4:
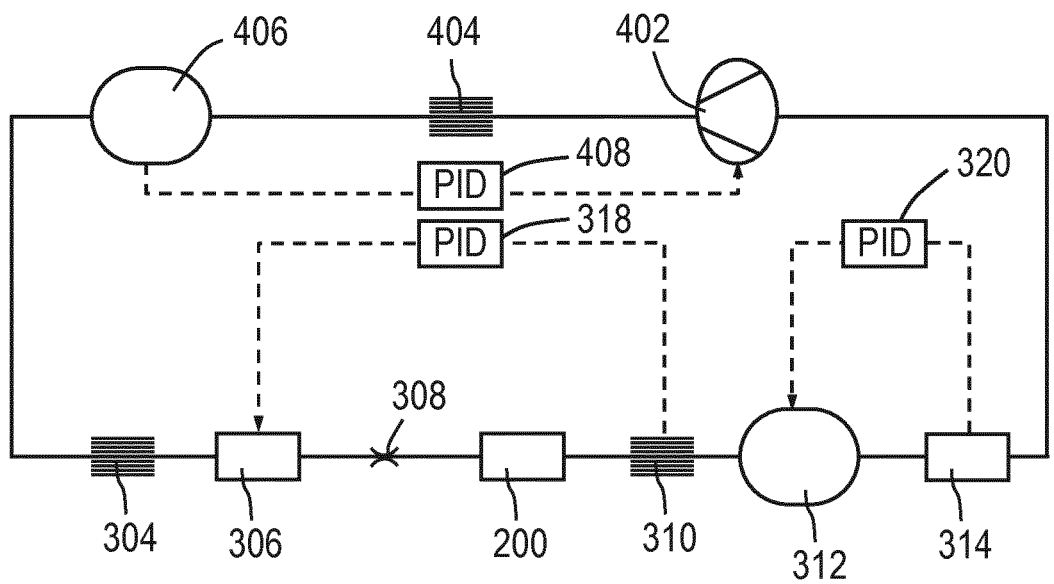
FIG. 4 depicts another example of a cooling system for use with a cooling apparatus for a lithographic apparatus according to the invention.

FIG. 4 shows another example of a cooling system 400. In FIG. 4, the cooling system 400 is in the form of a cooling circuit. Elements of cooling system 400 which are also present in cooling system 300 (as shown in FIG. 3) will not be described in more detail here.

Unlike cooling system 300 shown in FIG. 3, no exhaust is provided in cooling system 400 of FIG. 4. Instead, the cooling fluid is supplied to a compressor 402 after passing through the pressure controller 314. The compressor 402 increases the pressure of the fluid to approximately 52 bar (5.2 MPa). The compressor may be controlled by means of a PID control 408. The recompressed fluid is then supplied to a further heat exchanger 404 which brings the temperature of the cooling fluid to 22° C. The cooling fluid is then supplied to a vessel 406 which acts as cooling fluid source for the cooling circuit (for example in place of the bottle 302 of the embodiment shown in FIG. 3).

The cooling fluid may be any suitable fluid. Particular examples of a suitable fluid include $N_2O$, $CO_2$, ethylene and methane.

Advantages of the above cooling system include local reduction of temperature to −80° C. within the cooling apparatus while the supply and return lines remain at 22° C. This results in no thermal disturbances to the environment.

In an embodiment, the present invention provides in a cooling system which comprises a cooling apparatus and a contamination control arrangement, the contamination control arrangement being configured to control or remove contamination of a surface of the cooling apparatus. Various embodiment of such a cooling system and contamination control arrangement are discussed in more detail below.

Figure 5A:
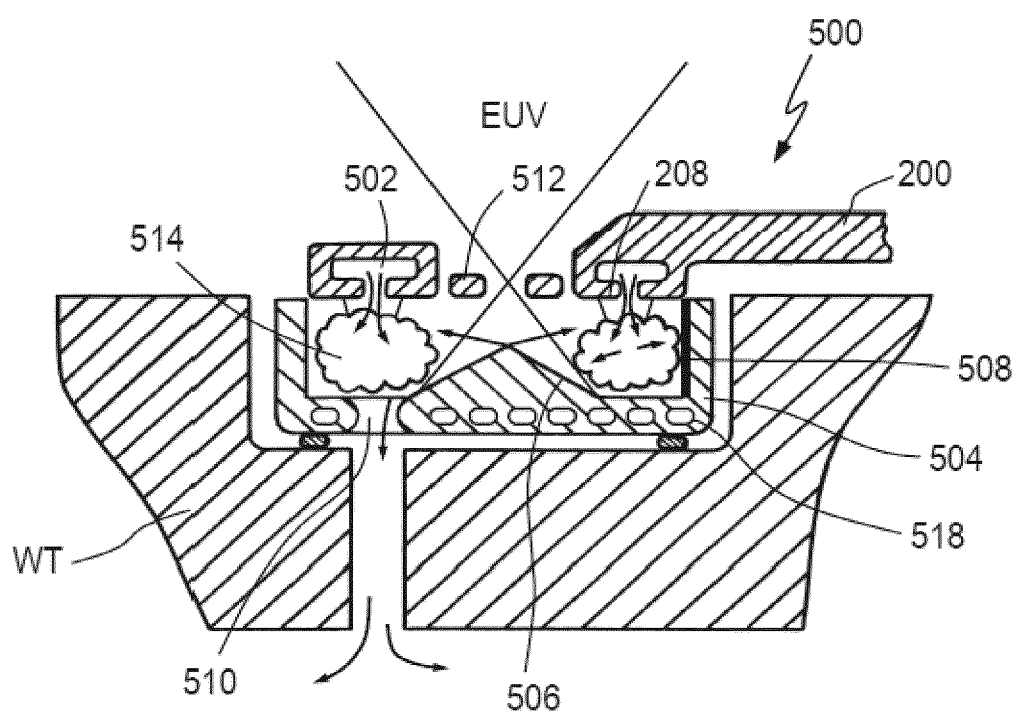
FIG. 5a depicts a cross-sectional view of an embodiment of a plasma-cleaning station in a lithographic apparatus according to the invention.

FIG. 5a shows a cross-sectional view of an embodiment of a plasma-cleaning station 500 for a lithographic apparatus. The lithographic apparatus comprises a projection system configured to project an EUV radiation beam to form an exposure area on a substrate held on a substrate table WT. The lithographic apparatus further comprises a cooling apparatus 200 located above the substrate table WT and adjacent to the exposure area. The cooling apparatus 200 is configured to remove heat from a substrate held on the substrate table WT when the substrate is exposed to the radiation beam projected by the projection system. The lithographic apparatus further comprises a gas source 502 located above the substrate table WT and adjacent to the exposure area.

As discussed above, the surface 208 of the cooling apparatus 200 which faces towards the substrate is prone to catching some resist outgassing species, such as $SnH_4$ and hydrocarbons. As the surface 208 becomes contaminated with hydrocarbons, the thermal accommodation coefficient (TAC) will begin to change. The change in TAC results in a drift in the heat transfer provided by the cooling apparatus and hence changes in wafer heating which may in turn lead to overlay errors during lithographic exposures.

In an embodiment, the outgassed hydrocarbons are plasma-etched from the surface 208 of the cooling apparatus 200. A plasma vessel 504 is arranged in the vicinity of the substrate table WT, for example on a substrate table carrier (or "chuck"), when no substrate is in position. The plasma vessel may take the form of a cup-like member, having a base and side walls. As will be apparent from the following description, however, the plasma vessel may take any form suitable for receiving gas and radiation for forming a plasma within the plasma vessel. The plasma vessel 504 comprises an opening which faces towards the surface 208 of the cooling apparatus 200. The plasma vessel 504 comprises a reflector portion 506 for reflecting radiation. The portion 506 may be, for example, a multilayer reflector. The plasma vessel 504 also comprises an absorber 508 for absorbing radiation. The absorber 508 may comprise any material suitable for absorbing EUV radiation. The plasma vessel 504 further comprises an outlet 510 in its base which allows contamination to pass through. The plasma vessel 504 further comprises a restriction means 512 in the form of bars which are connected between opposite sides of the plasma vessel 504. In the cross-sectional view of FIG. 5a, the restriction means extend into and/or out from the page. It will be appreciated that FIG. 5a depicts an exemplary arrangement and that other embodiments comprise other arrangements. For example, in some embodiments, the plasma vessel may not comprise one or more of the restriction means 512, the outlet 510, the reflector portion 506 and the absorber 508.

The reflector 506 is arranged within the plasma vessel 504 such that the reflected radiation is not incident on the surface of the cooling apparatus 200 which faces the plasma vessel 504. The absorber 508 is arranged within the plasma vessel 504 such that it can absorb radiation EUV which may have been reflected by the reflector 506. In this way, carbonization of the surface 208 of the cooling apparatus 200 is avoided.

In some embodiments, part of the absorber 508 may be replaced by an additional reflector so that radiation incident on the additional reflector is reflected back towards the center of the plasma vessel. The reflector may be a multi-layer reflector. In such embodiments, at least part of the wall of the plasma vessel 504 comprising the absorber and additional reflector is angled inwards towards the center of the plasma vessel such that radiation incident on the additional reflector is reflected away from the surface 208 of the cooling apparatus 200.

In the exemplary embodiment of FIG. 5a, the reflector 506 forms a pyramid on a base of the plasma vessel, with the apex of the pyramid central to the received radiation beam and the base of the pyramid at least as wide as the largest dimension of the cross section of the beam incident on the reflector. The angles of the side walls of the reflector 506 are selected so as to prevent reflection of radiation towards the surface 208 of the cooling apparatus 200. Alternatively, the reflector 506 may have a conical shape. In FIG. 5a, the absorber 508 is on the internal side walls of the plasma vessel, such that the radiation reflected from the reflector 506 is directed towards the absorber 508. It will be appreciated that the reflector may be arranged otherwise to the exemplary embodiment of FIG. 5a. For example, in an embodiment, the reflector may comprise a multi-faceted surface to reflect the received radiation beam at a plurality of angles within the plasma vessel 504. In other embodiments, the reflector may take a different form and may not, for example, be pyramid shaped.

The gas source 502 supplies a gas, such as $H_2$, for example, to the plasma vessel 504 at a pressure. For example, the pressure in the plasma vessel 504 may preferably be in the range from 10 to 10,000 Pa. More preferably, the pressure in the plasma vessel 504 may be in the range from 20 to 200 Pa. It will be appreciated by the person skilled in the art that the higher the pressure in the plasma vessel 504, the more quickly the surface 208 of the cooling apparatus 200 can be cleaned. However, it may be desirable to choose the pressure such that the functionality of the dynamic gas lock ("DGL") is not unduly affected. For example, in some embodiments, a pressure of approximately 100 Pa may be considered to be a suitable compromise between fast cleaning and acceptable functionality of the DGL. In other embodiments, a different pressure may be selected. The skilled person will be able to determine an appropriate pressure according to the circumstances.

Plasma 514 is generated in the plasma vessel 504 when the radiation EUV is incident on the pressurised gas. As the plasma 514 expands within the plasma vessel 504, it comes into contact with the long-chain hydrocarbons present on the surface 208 of the cooling apparatus 200 which faces the plasma vessel 504. The long-chain hydrocarbons are etched to form methane ($CH_4$) and stannane ($SnH_4$). Methane is very volatile and has residence times on the surface of the cooling apparatus of <1 ms even at the cold operating temperatures of the cooling apparatus 200.

While the gas source 502 is depicted in FIG. 5a as a part of the cooling apparatus 200, the gas source may be separate to the cooling apparatus in other embodiments. For example, in an embodiment, the gas source 502 may be provided by a dynamic gas lock provided to prevent contamination. Dynamic gas locks are known to those skilled in the art and as such are not described in detail herein.

The pressure within the plasma vessel 504 may be maintained such that any contaminants which are etched from the surface of the cooling apparatus 200 are forced downwards towards the outlet 510 in the base of the plasma vessel 504. The restriction means 512 provide a physical barrier which assists with maintaining the gas pressure while still allowing the radiation EUV to pass through into the plasma vessel 504.

The plasma vessel 504 may be made from any suitable material, for example ultra-low expansion (ULE™) glass.

Channels 518 are provided within the body of the plasma vessel 504 at the base thereof in order for a coolant to pass through the channels.

Figure 5B:
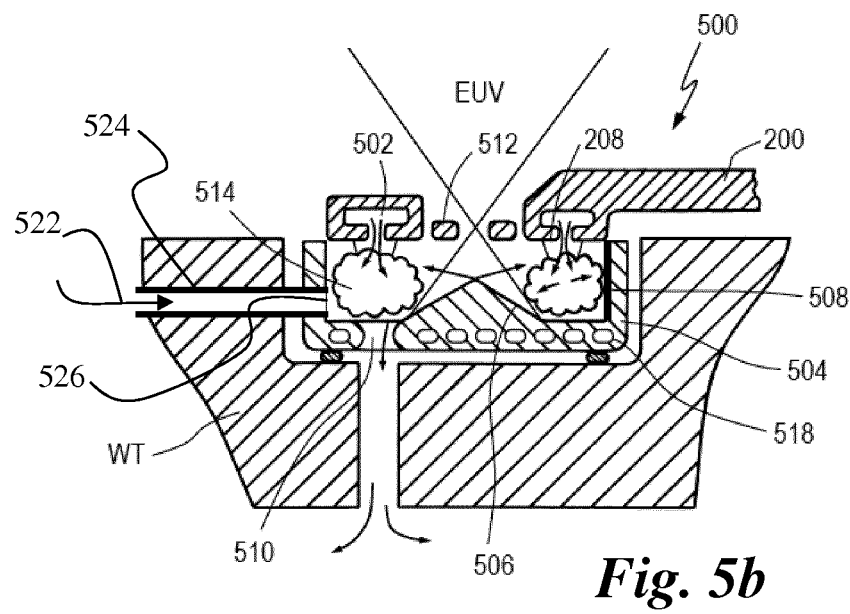
FIG. 5b depicts a cross-sectional view of another embodiment of a plasma-cleaning station as can be applied in the present invention.

In an embodiment of the present invention, the plasma cleaning process can be made more effective by adding an additional flow of gas to the plasma vessel 504. Such an embodiment is schematically shown in FIG. 5b. in the embodiment as schematically shown in FIG. 5b, an additional flow of gas 522 is provided to the plasma vessel 504 via a tube 524 having an opening 526. In an embodiment, the additional flow of gas 522 comprises Argon, Neon, oxygen ($O_2$), nitrogen ($N_2$), water ($H_2O$) or hydrogen ($H_2$), or a combination thereof. It can be pointed out that e.g. Neon may absorb the EUV radiation more effectively and will not generate reactive compounds. Rather, it will chemically sputter off the carbon or hydro-carbon contamination. The increased effectiveness of the cleaning process may enable to perform the cleaning process on a shorter time-scale.

In an embodiment, the additional flow of gas 522 as e.g. supplied via the tube 524 to the plasma vessel 504 may contain ozon or ozon plasma.

Figure 5C:
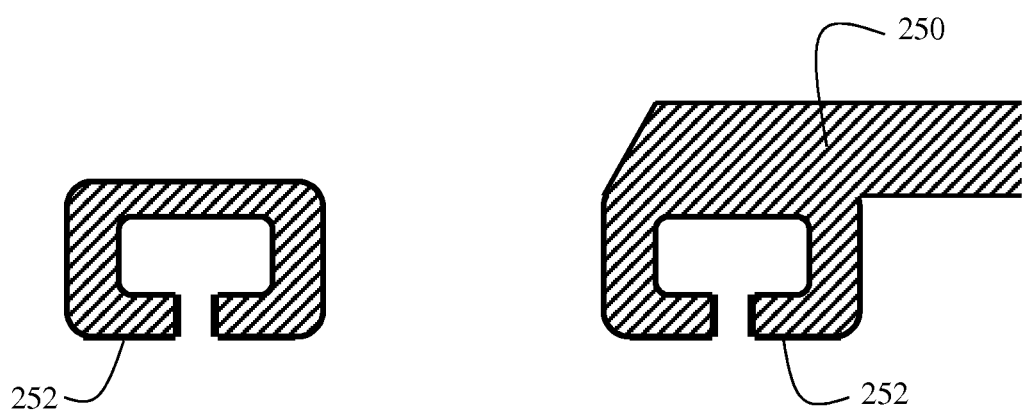
FIG. 5c depicts a cross-sectional view of a cooling apparatus as can be applied in the present invention, the cooling apparatus comprising a coating.

In an embodiment of the present invention, the cooling apparatus, e.g. cooling apparatus 200 is provided with coating of a non-sticking or low-sticking material. In particular, a surface of the cooling apparatus which during normal use faces a substrate or the wafer table WT may be provided with such a coating. FIG. 5c schematically shows a cross-sectional view of a cooling apparatus 250 as can be applied in the present invention, the cooling apparatus 250 being provided with a non-sticking or low-sticking coating 252. In an embodiment, the non-sticking or low-sticking coating 252 may comprise a plastic or polytetrafluorethylene (PTFE).

In an embodiment, the coating 252 as e.g. applied to a surface of the cooling apparatus 250 which, during use faces a substrate or substrate table WT, may comprise Zirconium Nitride (ZrN). Zirconium Nitride can be considered to have low-sticking properties for water and alkanes or hydrocarbon contaminants. Alternatively, low-sticking metals, metal oxides or metal nitrides may be considered as well.

In an embodiment, the use of Boron (B) can be considered as a coating material. Boron is expected to have a low adsorption energy resulting in a low-sticking behavior. Further, Boron is expected to have good plasma resistance properties, enabling it to be cleaned efficiently and fast with a plasma, e.g. an aggressive plasma. It is further expected that Boron will not oxidize during normal operation of the lithographic apparatus. In an embodiment, a surface of the cooling apparatus may be coated with a multi-layer coating, e.g. a 2-layer coating. By applying a multilayer coating, contradicting requirements may e.g. be met. It would be desirable to ensure that the emissivity of the coating is as low as possible. In order to realize this, a layer of metal in particular shiny metals such as silver would be desirable. By having a low emissivity, the cooling apparatus at low temperature can be arranged to have a substantially constant heat transfer. We want this because the cooling apparatus at low temperature should have a constant heat-transfer. It has been observed that by applying a low-emissivity material or layer, the sensitivity of the heat transfer for variations of the wafer surface, in particular the stack of layers present on the wafer, is reduced. A possible drawback of the application of a metal coating or metal layer may be that contamination may stick to the layer or coating and that the metal should not come in contact with a plasma. This drawback may be alleviated by coating the metal layer or coating with a thin layer, e.g. 10-100 nm layer, of isolating, non-sticking material such as plastic, Teflon or the like. Because of the application of a thin layer which has no free electrons for photons, it behaves as transparent. By doing so, the 2-layer coating provides in an inner layer to realize an effective low emissivity and hence, low sensitivity for changes in a wafer emissivity, and at the same time have the non-sticking properties that are governed by the outer layer. As such, the coating of the inner layer allows the usage of materials like metals which are not in direct contact with vacuum, thus reducing the risk of metal atoms contaminating the wafer.

Figure 5D:
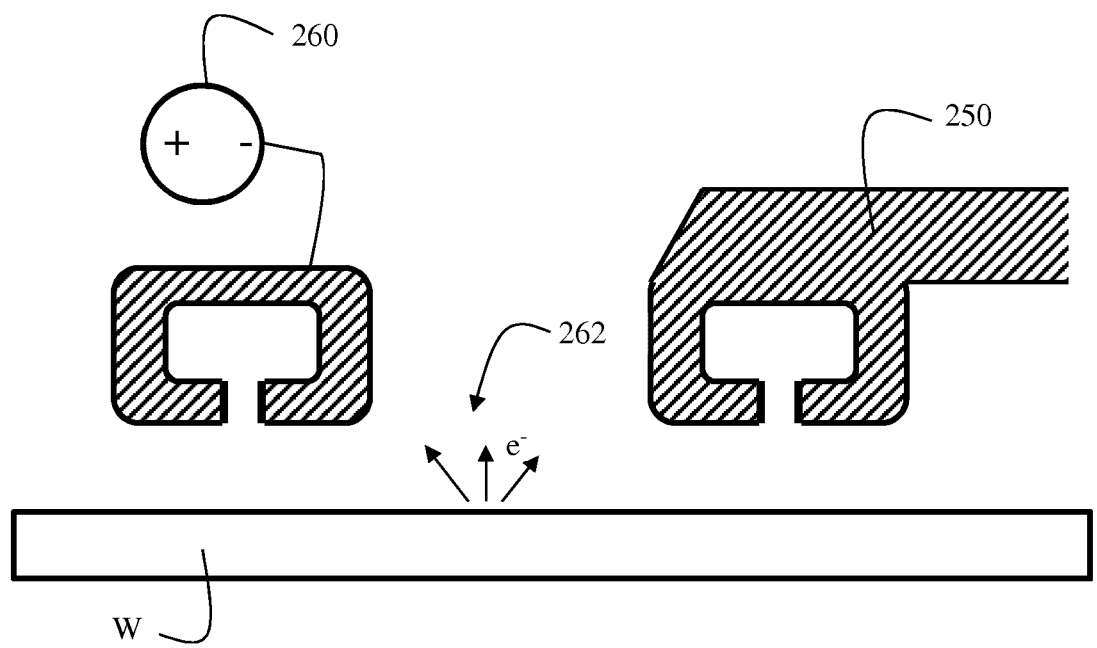
FIG. 5d depicts a cross-sectional view of a cooling apparatus as can be applied in the present invention, the cooling apparatus comprising a DC voltage source.

In an embodiment of the present invention, the cooling apparatus as applied may be connected to a DC voltage source, in order to hinder secondary electrons, e.g. generated by the interaction of a resist layer and EUV radiation, to reach the cooling apparatus. Such an embodiment is schematically shown in FIG. 5d. FIG. 5d schematically shows a cross-sectional view of a cooling apparatus 250 as can be applied in the present invention, the cooling apparatus 250 being connected to a DC voltage source 260. By applying a suitable voltage to the cooling apparatus 250, e.g. a DC voltage of −10 V, secondary electrons 262 emitted from the substrate W will decelerate and will not reach the cooling apparatus 250. In case such secondary electrons would reach the surface of the cooling apparatus facing the substrate, they could crack the contaminants on the cooling apparatus to carbonize and generate undefined carbon layers on the surface.

Figure 5E:
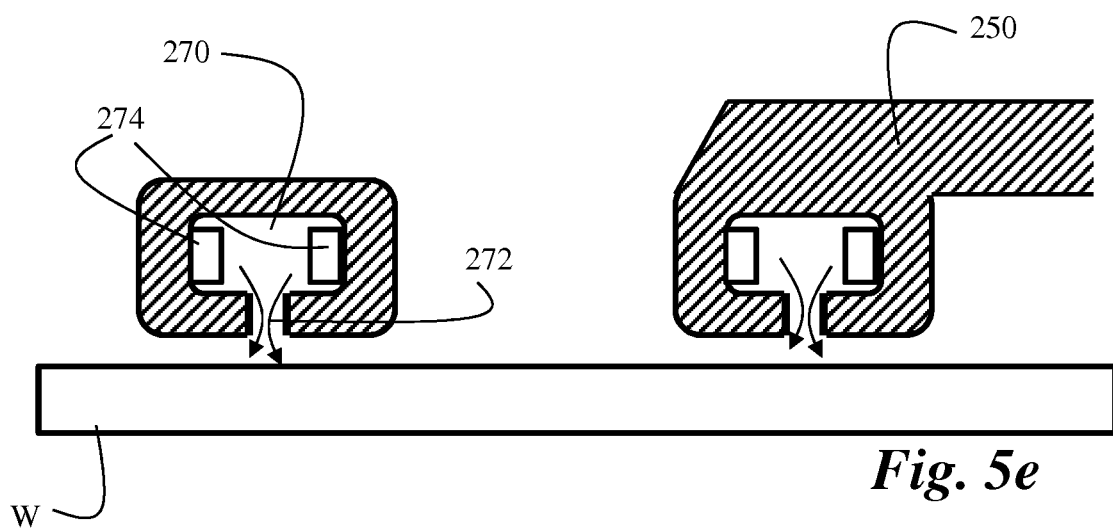
FIG. 5e depicts a cross-sectional view of a cooling apparatus as can be applied in the present invention, the cooling apparatus comprising a plasma generator.

In an embodiment of the present invention, the cooling apparatus as applied may be configured to generate a cleaning plasma for cleaning a surface of the cooling apparatus. Such an embodiment is schematically shown in FIG. 5e. FIG. 5e schematically shows a cross-sectional view of a cooling apparatus 250 as can be applied in the present invention, the cooling apparatus 250 comprising a gas source 270, comparable to gas source 502 as discussed about, which is configured to supply a gas, such as Hz, for example, to an area or volume between the cooling apparatus 250 and the substrate W, as indicated by the arrows 272. In the embodiment as shown, the cooling apparatus further comprises a plasma generator 274 for generating a plasma from the supplied gas. As a result, a plasma can be provided to the area or volume between the cooling apparatus 250 and the substrate W, said plasma enabling to clean a surface of the cooling apparatus 250, e.g. surface 276 of the cooling apparatus 250 facing the substrate W. In an embodiment, the plasma generator 274 comprises one or more RF-coils for generating the plasma. Alternatively, an electron beam, e.g. an e-gun, or a laser beam may be applied as well as for generating the plasma. It is submitted that part of the radicals of the plasma may regenerate before entering the area between the cooling apparatus 250 and the substrate W. However, it is expected that a significant part of the radicals may reach the area between the cooling apparatus 250 and the substrate W, thus enabling a cleaning of the surface of the cooling apparatus 250 that faces the substrate W, e.g. by removing carbon contaminants from the surface.

FIG. 6 depicts a lateral sectional view of an embodiment of a cooling apparatus 600. As described above, the cooling apparatus 600 may be part of a lithographic apparatus comprising a radiation source (not shown) for supplying a radiation beam EUV to an area of a substrate W under exposure. As described with reference to the cooling apparatus 200 of FIG. 2, the cooling apparatus 600 comprises a gas source (not shown) for supplying a pressurised gas to the region above the area of the substrate W under exposure.

As described above with reference to FIG. 5, when the radiation EUV is incident on the pressurised gas, a plasma 602 is created. The plasma forms radicals 604, which emanate radially outwards from the plasma 602 towards surfaces of the cooling apparatus 200. For example, the plasma radicals 604 may be incident on a surface 606 of the cooling apparatus that is in the vicinity of the plasma 602. When the plasma radicals are incident on the surface 606 of the cooling apparatus 600 or of parts thereof, plasma etching of substances on the surface 606 may occur. For example, in order to prevent excessive wear of the surface 606, a coating 608 may be provided on the surface 606. The coating 608 may facilitate a high recombination (or coupling) probability. For example, the coating may act as a catalyst in the recombination of plasma radicals to form inert molecules. In other words, the coating 608 can be provided to make it more likely that highly reactive plasma radicals 604 that are incident on the surface 606 (or parts thereof) provided with the coating 608 will recombine to form inert molecules. In particular, the coating 608 increases the chance that a first radical temporarily in contact with the surface 606 provided with the coating 608 will recombine with one or more further radicals to form an inert molecule when the one or more further radicals collide with the first radical or with the surface 606 in the vicinity of the first radical. In this way, excessive wear of the surface 606 may be avoided.

The coating 608 may be provided on one or more portions of the surface 606 that are not active in the cooling function of the cooling apparatus 600. For example and as shown in FIG. 6, the coating 608 may be provided on side walls 610 of the cooling apparatus 600 which extend generally in the direction of propagation of the radiation beam EUV. As the side walls 610 are less active in the cooling function of the cooling apparatus (for example as compared to the bottom surface 612), it may be less desirable to provide plasma-etching of the side walls 610 for cleaning purposes. For example, although it may be desirable to provide plasma-etching of the bottom surface 612 of the cooling apparatus 200 in order to decrease the likelihood of a change in the thermal accommodation coefficient (TAC), as described above with reference to FIG. 5, it may be less desirable to provide plasma-etching of surfaces which are less active in the cooling function since the TAC is of lower importance for such surfaces.

FIG. 7a depicts a lateral sectional view of another exemplary embodiment of a cooling apparatus 700. In this embodiment, a ribbed structure 706 has been provided, or formed, on a side wall of the cooling apparatus 700. In alternative embodiments, the structure 706 may be a honeycomb structure or any other structure which increases the surface area of the side wall of the cooling apparatus 700. In particular, the design of the structure may be selected to increase the number of times a plasma radical is incident on the surface, as described in more detail below with reference to FIG. 7b.

The structure 706 is provided with a coating 708 which facilitates a high recombination probability. The increase in surface area provided by the ribbed structure 706 means that there is an even greater chance of recombination of the hydrogen radicals resulting from the plasma. The recombination probability may be increased by, for example, a factor of two with the ribbed surface 706 as compared with the substantially smooth surface 606 depicted in FIG. 6.

FIG. 7b provides a detailed view of a part of the ribbed structure 706 of FIG. 7a. FIG. 7b shows a potential path 710 of a plasma radical as it is incident on the ribbed structure 706. It can be seen that the radical is incident on the surface 706 multiple times (e.g., three in the example shown in FIG. 7b). Each impact of the plasma radical with the surface 706 provides an additional chance for the plasma radical to recombine with another plasma radical. In this embodiment, not only does the coating 708 with high recombination probability contribute to the increased chance of recombination, but also the structure of the surface plays a part as well.

The coating 708 selected to increase a radical recombination probability may comprise, for example, a metallic material. For example, the coating 708 may be selected so as to have a high recombination probability of at least 10%, preferably at least 15%. In an embodiment, the coating 708 may comprise one or more of nickel (Ni), iron (Fe), chromium (Cr), cobalt (Co) or others. For example, a coating comprising nickel may provide a recombination probability of about 20%. In other words, there may be a 20% chance that a first radical temporarily in contact with the surface provided with the coating will recombine with one or more further radicals to form an inert molecule when the one or more further radicals collide with the first radical or with the surface in the vicinity of the first radical.

In some embodiments, the cooling apparatus itself may comprise a material having a high recombination probability of at least 10%, preferably at least 15%. For example, the cooling apparatus may comprise one or more of nickel (Ni), iron (Fe), chromium (Cr), cobalt (Co) or others. In this case, a coating may not be provided on a surface of the cooling apparatus. With reference to FIG. 6, the cooling apparatus comprising a material having a high recombination probability of for example 20% may make it more likely that highly reactive plasma radicals that are incident on the surface 606 (or parts thereof) of the cooling apparatus will recombine to form inert molecules. In this way, excessive wear of the surface 606 may be avoided. A ribbed structure may be provided or formed on a surface of the cooling apparatus, as described above in conjunction with FIGS. 7a and 7b. In alternative embodiments, the structure may be a honeycomb structure or any other structure which increases the surface area of the surface of the cooling apparatus, thereby to provide more chances for radicals to become incident on the surface.

In FIGS. 8a, 8b (hereinafter also collectively referred to as FIG. 8), another technique to decrease the likelihood of a change in the thermal accommodation coefficient (TAC) is schematically illustrated. In the embodiment of FIG. 8, a layer of material of known composition and phase (such as $H_2O$) is caused to form on surfaces of the cooling apparatus, such as the bottom surface 208 (shown in FIG. 1). The layer may be caused to form at a rate greater than the rate at which outgassing molecules contaminate those surfaces.

With reference to FIG. 8a, an arrangement 800 is depicted comprising a cooling element 802 having a bottom surface (or cooling surface) 804 which opposes a substrate W. The substrate W comprises a resist layer 806. A cooling gas is provided between the bottom surface 804 of the cooling element 802 and the resist layer 806/substrate W. As described above with reference to FIGS. 2 and 6, the cooling gas has a lower temperature than the substrate W. The cooling gas facilitates transfer of heat from the substrate W to the cooling apparatus 800 (which has a lower temperature than the substrate). The cooling gas thus acts to cool the substrate. The cooling gas may be, for example, at a temperature of approximately −70 degrees C. when leaving the cooling apparatus. The cooling gas comprises molecules 808, which alternately collide with the resist layer 806 and the bottom surface 804 of the cooling element 802. As described above, outgassing from the resist layer 806 may create deposits on the bottom surface 804, changing the accommodation coefficient of the bottom surface 804 and changing the ability of the cooling element 802 to cool the resist layer 806.

In the embodiment depicted in FIG. 8a, a trapping agent is provided into the area between the substrate W (more particularly the resist layer 806) and the cooling element 802 adjacent the bottom surface 804. The trapping agent becomes deposited on the bottom surface 804. In an embodiment, in the area between the resist layer 806 and the bottom surface 804, the trapping agent may be take then form of a vapour that solidifies or condenses on the bottom surface 804 to form a trapping layer 810. The trapping layer 810 may be a solid layer (e.g. of ice) or may be liquid film (e.g. of water) that is continuous across the bottom surface 804. Molecules 805 of the trapping agent in the area between the resist layer 806 and the bottom surface 805 (i.e. which have not yet formed a part of the trapping layer 810) are depicted as squares in FIG. 8.

The trapping agent is provided to the area between the resist layer 806 and the bottom surface 804 at a rate such that the deposition rate of the trapping agent on the bottom surface 804 is greater than the deposition rate of outgassed materials from the resist layer 806 on the bottom surface 804. As such, the trapping layer 810 grows at a rate greater than that of the rate of growth of the outgassed species on the bottom surface 804. It will be appreciated that the rate at which the trapping agent is provided may depend upon the rate at which the outgassed species contaminate the bottom surface 804, which in turn may depend upon a number of factors including the composition of the resist, the power the radiation beam, etc.

As shown in FIG. 8b, the trapping layer 810 dissolves (e.g. when in liquid form) or otherwise traps (e.g. when in solid form) outgassed molecules 812. Because the trapping layer 810 grows at a greater rate than the outgassed molecules 812 are deposited, the cooling molecules 808 will mostly encounter the surface of the trapping layer 810 after rebounding from the resist layer 806, thereby providing a cooling surface with a stable accommodation coefficient.

The trapping agent is provided to the area between the substrate and the bottom surface 804 at a pressure that is lower than that of the cooling gas. For example, the pressure of the trapping agent $P_T$ may be $0.001 P_c < P_T < 100 P_c$, where Pc is the pressure of the cooling gas. To provide a solid layer (e.g of ice) or a film of liquid (e.g. of water) on the bottom surface 804, the pressure of the trapping agent $P_T$ vapour need be maintained at least above the saturation pressure of the trapping agent.

Periodically, or when the trapping layer 810 exceeds a predetermined threshold (e.g. grows beyond a predetermined depth), the cooling surface 804 may be warmed to allow removal of the trapping layer 810 together with the outgassed molecules 812. The removal of the trapping layer 810 may occur during periods when the substrate is not being exposed/imaged.

In an embodiment, the bottom surface 804 may be provided with a coating (not shown) that promotes wetting of the bottom surface 804 by the trapping agent to form the trapping layer 810. For example, the bottom surface 804 may be provided with a hydrophilic, superhydrophilic (also known as superwetting) and/or "icephilic" coating (that is attracted to or promotes ice). Such a coating has the advantage of preventing or reducing the growth of crystals or of a liquid layer forming into droplets that could touch with the substrate W. Example coatings include titanium dioxide ($TiO_2$), or zirconium dioxide ($ZrO_2$), zinc oxide (ZnO) or reaction products of zirconium, titanium or zirconium-titanium alloy, oxygen and nitrogen (e.g. $Ti_x Zr_y O_z N_w$).

The trapping agent may take any suitable form and is provided from a trapping agent delivery system (not shown). In an embodiment, the trapping agent may be $H_2O$. The trapping agent or precursors to the trapping agent may be delivered to the bottom surface 804 in any appropriate manner. It will be appreciated that the where the trapping agent is created through the provision of a precursor, at least part of the trapping agent delivery system may be arranged to provide the precursor. That is, the trapping agent delivery system may be any combination of devices cause the trapping agent to be provided in the area between the resist layer 806 and the bottom surface 804. A number of exemplary mechanisms for providing the trapping layer 810 are described below but it will be understood that any mechanism may be used and that the exemplary mechanisms are non-limiting.

In an example embodiment, the trapping agent (e.g. in the form of $H_2O$ vapour) may be mixed into the cooling gas that is expelled from the cooling element 802. In this case, the trapping agent delivery system (not shown) may be a source of $H_2O$ vapour. The source of $H_2O$ vapour may be connected to the same delivery mechanism as the source of the cooling gas (not shown) or may be connected to a different delivery mechanism. For example, in an exemplary embodiment, the gas that is expelled from the cooling element 802 may comprise between 90-99.9% cooling gas (e.g. hydrogen) and between 0.1-10% trapping agent (e.g. $H_2O$ vapour) with the trapping agent having a partial pressure of between 0.1-10 Pa.

In another exemplary embodiment, the trapping agent may be created through a reaction of a trapping agent precursor with the cooling gas (or with active species present in the area adjacent the substrate W). For example, in an embodiment, the trapping agent may be created through the release of oxygen ($O_2$) (e.g. mixed into the cooling gas) which reacts with hydrogen and hydrogen ions/radicals created within the radiation beam to form $H_2O$. The created $H_2O$ will then diffuse into the area between the resist layer 806 and the bottom surface 804. In another exemplary embodiment, where a dynamic gas-lock is provided, $H_2O$ vapor or oxygen ($O_2$) may be mixed with the dynamic gas-lock gas, or from another source either inside or outside of the cooling apparatus 800. In this case, the trapping agent delivery system may comprise a source of oxygen ($O_2$) connected to a delivery mechanism (not shown) for providing the oxygen to an area adjacent the resist layer 806.

In another exemplary embodiment, the trapping agent delivery system may provide the trapping agent in liquid form on the resist. For example, a layer of liquid $H_2O$ (e.g. a monolayer or submonolayer) or one or more $H_2O$ droplets may be provided on the resist layer 806 prior to exposure of the resist layer 806 by the radiation beam. In this case, the trapping agent delivery system may be considered to be the layer of trapping agent on the resist or to the mechanism for providing layer of trapping agent on the resist. The mechanism (not shown) for providing the layer of liquid trapping agent may take any appropriate form, including, for example, a vessel for storing the trapping agent, a pump for transporting the trapping agent and a nozzle for emitting the trapping agent to a desired location. Referring to FIG. 9a, a cooling apparatus 900 is depicted comprising a cooling element 902. The cooling apparatus further comprises upper thermal shields 904 positioned above the cooling element 902 (with respect to the direction of propagation of the depicted radiation beam EUV) and lower thermal shields 906 between the cooling element 902 and the substrate W adjacent an exposure area. FIG. 9a further depicts droplets 910 and a film 912 of the trapping agent deposited on a resist layer 908. It will be appreciated that either or both of the droplets 910 or film 912 may be provided in different embodiments. Heat from the radiation beam will cause the droplets 910 or film 912 to evaporate from the resist layer 908 and coat a bottom surface 914 of the cooling element 902. For example, in an embodiment, $H_2O$ may be applied to scribe lines (not shown) on the substrate W to avoid interaction of the $H_2O$ with patterns or alignment marks on the substrate W.

Figure 9B:
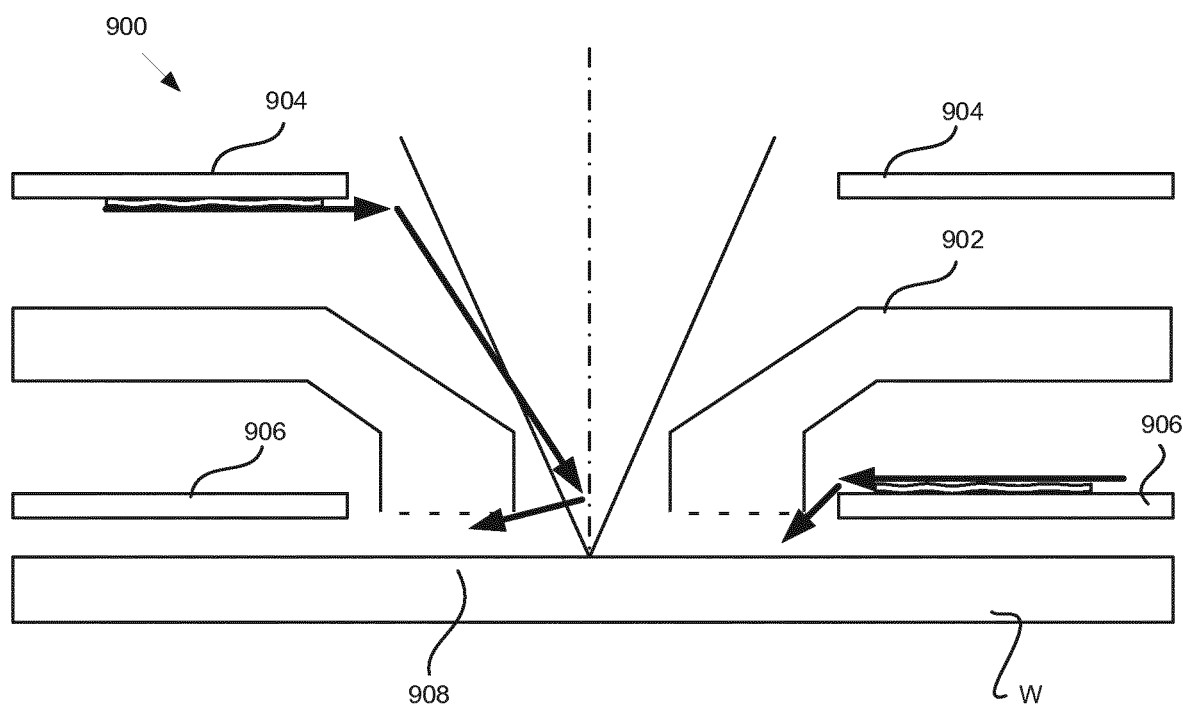
FIG. 9b depicts a cooling apparatus in which a trapping agent is provided on thermal shielding of the cooling apparatus.

In another exemplary embodiment, a solid or liquid layer of the trapping agent (e.g., ice or water) may be deposited on one or more surfaces of the cooling element 802 prior to an exposure operation. In this case, the trapping agent delivery system may be considered to be the layer of trapping agent on the resist or the mechanism for providing layer of trapping agent on the resist. Referring to FIG. 9b, the cooling apparatus 900 is again depicted. In FIG. 9b, however, a layer of trapping agent has been applied to the upper shielding 904 and to the lower shielding 906. It will be appreciated that the trapping agent may be applied to either or both of the upper and lower shielding 904, 906. Similarly, while FIG. 9b depicts a layer of the trapping agent on only part of each of the upper and lower shielding 903, 906, it will be appreciated that FIGS. 9a, 9b are merely schematic and that the trapping agent may be otherwise applied. The pre-deposited layer of trapping agent will redistribute (for example through sublimation and redeposition) to cover the bottom surface 914 in a uniform layer. In an embodiment, layers of ice or water may be deposited on surfaces of the cooling element 902 during periods when a substrate table on which the substrate W is held is moved from beneath the cooling element 902 and higher (or lower) vacuum and higher/lower trapping agent partial pressure is provided. In an embodiment, the pre-depositing of ice or liquid may be performed at a temperature above or below the final operating temperature (i.e. the operating temperature of the cooling element 802, 902), so as to provide a more uniform thickness and/or amorphous ice starting layer or liquid film starting layer and thus promote uniform deposition during operation of the lithographic apparatus.

In an embodiment, a modifying agent, such as ethanol (C2H5OH) (e.g. in vapour form) or other, preferably polar, molecule, may be provided by a modifying agent delivery system, which may take any suitable form. The presence, and partial co-condensation, of the modifying agent on the bottom surface 804, 914 may help to disorient molecules of the trapping agent as they form a trapping layer (i.e. the trapping layer 810) and promote amorphous distribution of molecules within the trapping layer 810 (e.g. amorphous ice). The presence of a modifying agent may further promote even deposition of the trapping agent on the bottom surface 804, 914, helping to prevent, e.g. icicle growth that may scratch the substrate W and/or resist layer 806, 908. The way in which the modifying agent is provided with the trapping agent may depend upon the mechanism by which the trapping agent itself is provided. For example, where the trapping agent is provided through the introduction of a vapour in the area between the resist layer 806, 908 and the bottom surface 804, 914, a modifying agent may be mixed with the trapping agent vapour (e.g. constantly or periodically). Where the trapping agent is provided through the application of liquid film 912 or droplets 910 on the resist layer 908, a modifying agent may be mixed with the liquid film 912 and/or droplets 910. In another embodiment, a modifying agent (e.g. in the form of ethanol ($C_2H_5OH$) vapour) may be mixed with the cooling gas. Dry ethanol freezes below approximately −110 degrees C. and as such, where the cooling element and the cooling gas are at a temperature above −110 degrees C., it is possible to provide ethanol through orifices in the cooling element through which the cooling gas is expelled (depicted as holes in the bottom surface 914 in FIGS. 9a, 9b).

While ethanol is provided as an example of a modifying agent above, other polar molecules may be mixed with the trapping agent to alter the formation of the trapping layer 810. For example, other polar molecules that may be used include sulfur dioxide ($SO_2$), chloromethane ($CH_3Cl$), bromomethane ($CH_3Br$), chloroform ($CHCl_3$), acetone (CO $(CH_3)_2$), hydrogen peroxide ($H_2O_2$), methanol ($CH_3OH$), acetic acid ($CH_3COOH$), 1-propanol ($CH_3CH_2CH_2OH$), 2-propanol ($CH_3CHOHCH_3$), 1-butanol ($CH_3CH_2CH_2CH_2OH$), 2-butanol ($CH_3CHOHCH_2CH_3$) and formaldehyde ($CH_2O$).

Alternatively or additionally, by changing the content of the modifying agent, an outermost (or most recently formed) layer of the trapping layer 810 may be melted and reformed, or the structure of the trapping layer 810 may be altered. For example, deposition of ethanol vapor onto a trapping layer 810 formed of $H_2O$ will melt ice or disorient water molecules and prevent icicle formation. In an embodiment, a modifying agent may be provided only at the start of the operation of a lithographic apparatus in order to improve a distribution of a liquid film or solid film over a surface (e.g. the bottom surface 804) of the cooling element 802.

It will be appreciated that various examples of methods for providing the trapping agent are described above, and that any combination of two or more of the above described examples may be used.

In an embodiment, the cooling element may be provided with one or more heating elements on or in the vicinity of the bottom surface (or cooling surface). The one or more heating elements may be configured to heat a small area of the bottom surface. For example, the one or more heating elements may be arranged to heat only the area on which off-gassed vapours condense and/or freeze on the bottom surface. In this way, by heating only a small area, that area may be heated in a relatively short time span in comparison to heating the entire cooling element. In this way, fast cleaning of the bottom surface of the cooling element may be provided, allowing for cleaning of the cooling element during periods between exposure operations, for example.

The one or more heaters may take any appropriate form. The one or more heating elements may be, for example, thin film heating elements. The heating elements may be, for example, ceramic or intermetallic based heating elements.

Figure 10:
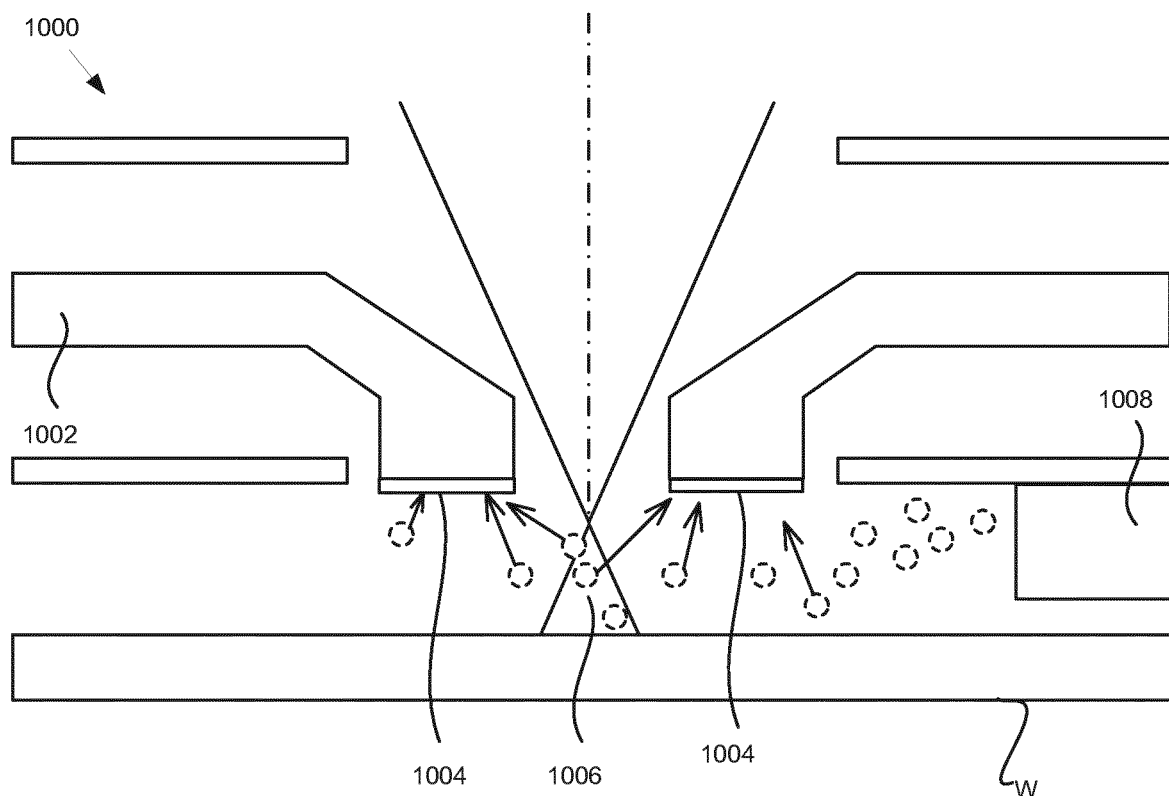
FIG. 10 depicts a cooling apparatus in which the cooling surface comprises a self-cleaning material and wherein the substrate has been moved out of the focal plane of the radiation beam.

In FIG. 10, another technique to decrease the likelihood of a change in the thermal accommodation coefficient is schematically illustrated. In the embodiment of FIG. 10, an arrangement 1000 is depicted comprising a cooling element 1002 having a bottom surface (or cooling surface) 1004 which opposes a substrate W. The cooling surface 1004 comprises a self-cleaning material. A gas 1006 is provided between the cooling surface 1004 and the substrate W. In operation, the gas 1006 is a cooling gas which has a lower temperature than the substrate W. The cooling gas facilitates transfer of heat from the substrate W to the cooling apparatus 1000, which has a lower temperature than the substrate. The cooling gas thus acts to cool the substrate. As described above, outgassing from a resist layer may create deposits on the bottom surface 1004, changing the accommodation coefficient of the bottom surface 104 and changing the ability of the cooling element 1002 to cool the substrate W. The substrate may be a resist layer.

In the embodiment depicted in FIG. 10, the substrate W has been moved out of the focal plane of the radiation beam for the purpose of cleaning the cooling surface 1004. It will be appreciated that when the substrate W is moved out of the focal plane of the radiation beam that a greater amount of the gas 1006 is exposed to the radiation. The radiation beam activated the gas 1006 and converts it into highly reactive species. Where the gas 1006 comprises hydrogen, this can produce hydrogen free radicals. Alternatively, where the gas comprises oxygen, oxygen free radicals may be produced. The highly reactive species are able to diffuse towards the cooling surface 1004 and react with the outgassing material which had adsorbed onto the cooling surface 1004. Also depicted in FIG. 10 is the optional source of active species, which in the exemplary case is a plasma source, 1008. The source of active species may be configured to produce additional reactive species, such as hydrogen or oxygen free radicals, in order to replace or supplement the free radicals produced by the interaction of the radiation beam with the gas 1006. The self-cleaning material comprising the cooling surface 1004 may be a catalytic material which catalyzes the decomposition of the outgassing material which adsorbs to the cooling surface 1004. Additionally or alternatively, the self-cleaning material may have low affinity for the outgassing material.

It will be appreciated that FIG. 10 depicts the substrate W as having been moved outside the focal plane of the radiation beam. Even when the substrate W is in the focal plane of the radiation beam, the radiation will interact with the gas 1006 to generate highly reactive species. Thus, cleaning of the cooling surface 1004 will occur when the lithographic apparatus is in use. The source of active species 1008 may be operated whilst the lithographic apparatus is in use.

Figure 11:
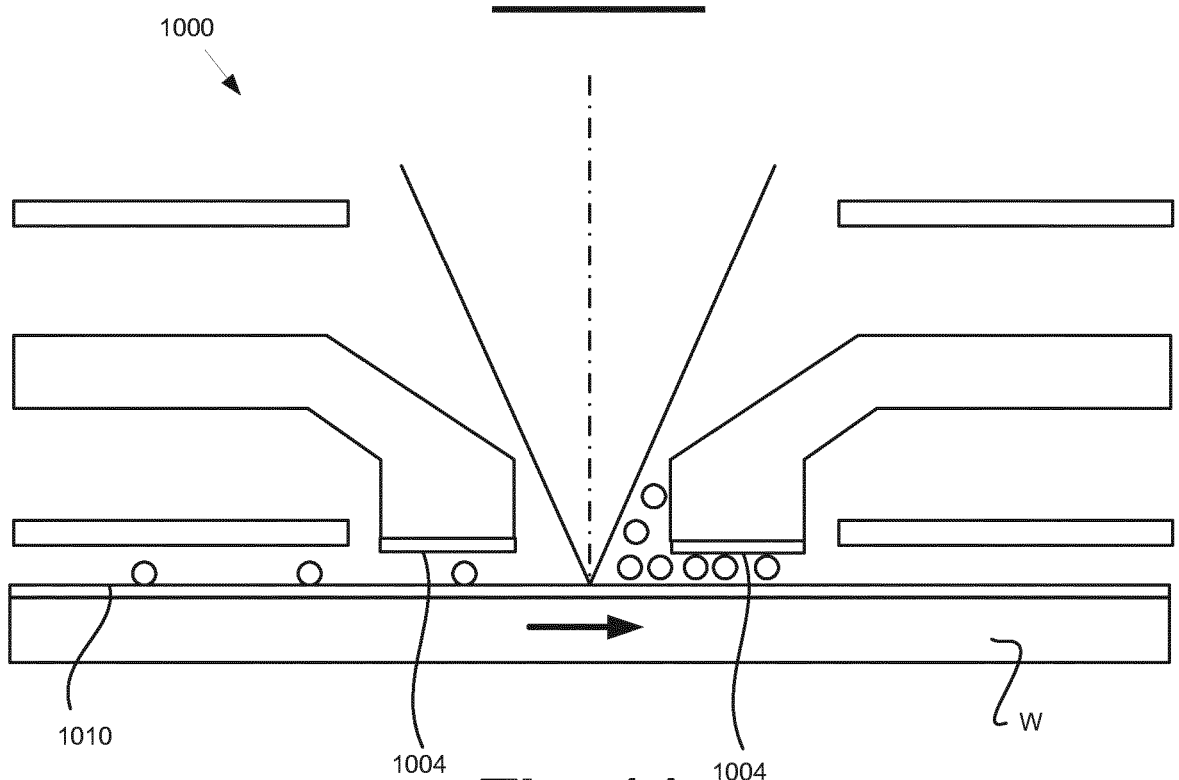
FIG. 11 depicts a cooling apparatus in which an oxidizing agent is provided and activated by the radiation beam.

In FIG. 11, another technique to clean the cooling surface is depicted. The substrate W is a non-imaging wafer which is used for cleaning purposes. The substrate W comprises a coating 1010 comprising an oxidizing agent, such as hydrogen peroxide, which is depicted schematically in FIG. 11 by a plurality of circles. As the substrate W passes through the radiation beam, shown in FIG. 11 as from left to right, the oxidizing agent is exposed to the radiation beam which causes the oxidizing agent to be released and to decompose into more reactive species. Since the decomposition is exothermic, the heat generated will increase the temperature of the substrate and thereby increase the rate at which the oxidizing agent is released and also decomposed. The reactive species generated by the release and decomposition of the oxidizing agent will react with outgassing materials present on the cooling surface 1004. The substrate W may be passed back and forth under the radiation beam in order to clean both sides of the cooling surface 1004.

In an embodiment, the invention may form part of a mask inspection apparatus. The mask inspection apparatus may use EUV radiation to illuminate a mask and use an imaging sensor to monitor radiation reflected from the mask. Images received by the imaging sensor are used to determine whether or not defects are present in the mask. The mask inspection apparatus may include optics (e.g. mirrors) configured to receive EUV radiation from an EUV radiation source and form it into a radiation beam to be directed at a mask. The mask inspection apparatus may further include optics (e.g. mirrors) configured to collect EUV radiation reflected from the mask and form an image of the mask at the imaging sensor. The mask inspection apparatus may include a processor configured to analyse the image of the mask at the imaging sensor, and to determine from that analysis whether any defects are present on the mask. The processor may further be configured to determine whether a detected mask defect will cause an unacceptable defect in images projected onto a substrate when the mask is used by a lithographic apparatus.

In an embodiment, the invention may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located immediately adjacent to a lithographic apparatus and may be used to measure the overlay before the substrate (and the resist) has been processed.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although FIG. 1 depicts the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO.

In an embodiment, the present invention provides in a lithographic apparatus comprising:
a projection system configured to project a patterned radiation beam to form an exposure area on a substrate;
a cooling apparatus located in use above the substrate adjacent to the exposure area, the cooling apparatus being configured to remove heat from the substrate during use;
a plasma vessel located below the cooling apparatus with its opening facing towards the cooling apparatus; and
a gas supply for supplying gas to the plasma vessel and an aperture for receipt of a radiation beam,
wherein in use supplied gas and a received radiation beam react to form a plasma within the plasma vessel that is directed towards a surface of the cooling apparatus which faces the opening of the plasma vessel. In an embodiment, the plasma vessel comprises a reflector for reflecting radiation from the received radiation beam within the plasma vessel. In an embodiment, the reflector comprises a pyramid or conical structure within a base of the plasma vessel.

In an embodiment, the plasma vessel comprises an absorber for absorbing radiation that has been reflected within the plasma vessel to prevent radiation being incident on the cooling apparatus. In an embodiment, the plasma vessel comprises an additional reflector located in the vicinity of the absorber, which additional reflector reflects radiation incident thereon back towards the centre of the plasma vessel. In an embodiment, the plasma vessel comprises a restriction means located at its opening, which restriction means permits at least a portion of the radiation beam to pass into the plasma vessel while restricting the passage of the gas out of the plasma vessel.

In an embodiment, of the lithographic apparatus, the gas is supplied from the cooling apparatus. In an embodiment, the gas is supplied from a dynamic gas lock.

In an embodiment, in use, the pressure in the plasma vessel is between 10 and 10000 Pa, preferably between 20 and 200 Pa, and more preferably is 100 Pa.

In an embodiment, the present invention provides in a plasma vessel for use in a lithographic apparatus, as described above. In an embodiment, such a plasma vessel comprises a reflector for reflecting radiation within the plasma vessel. In an embodiment, the reflector comprises a pyramid or conical structure within a base of the plasma vessel.

In an embodiment, the plasma vessel comprises an absorber for absorbing radiation that has been reflected within the plasma vessel to prevent radiation generated by the plasma being incident on the cooling apparatus. In an embodiment, the plasma vessel comprises an additional reflector located in the vicinity of the absorber, which additional reflector reflects radiation incident thereon back towards the centre of the plasma vessel.

In an embodiment, the plasma vessel comprises a restriction means located at its opening, which restriction means permits the radiation beam to pass while preventing the passage of the gas out of the plasma vessel.

In an embodiment, the present invention provides in a cooling system for use in a lithographic apparatus, the cooling system comprising:

a cooling fluid source for supplying a cooling fluid;

a cooling apparatus for cooling the lithographic apparatus, the cooling apparatus being fluidically connected downstream of the cooling fluid source; and a restriction within the cross-sectional area of the fluidic connection between the cooling fluid source and the cooling apparatus, which restriction effects a reduction in pressure of the cooling fluid thereby to cause a local reduction in temperature in the vicinity of the cooling apparatus. In an embodiment, the cooling system may further comprises a flow control unit fluidically connected downstream of the cooling fluid source and arranged to maintain a substantially constant flowrate through the restriction. In an embodiment, the cooling system may further comprise a superheater fluidically connected downstream of the cooling apparatus and arranged to evaporate cooling fluid downstream of the cooling hood. The cooling system may further comprise a controller connected between the superheater and the flow control unit, the controller arranged to control the flow control unit based upon operation of the superheater to minimise an amount of coolant fluid used.

The cooling system may further comprise a collection vessel fluidically connected downstream of the cooling apparatus and adapted to collect the cooling fluid. Such a cooling system may further comprise a pressure control unit fluidically connected downstream of the collection vessel and operable to control a pressure of the cooling fluid within the collection vessel and to maintain a reduced pressure of the cooling fluid downstream of the restriction. Such a cooling system may further comprise an exhaust fluidically connected downstream of the collection vessel in order to allow the cooling fluid to exit the cooling system. The cooling system may further comprise a compressor fluidically connected downstream of the collection vessel; wherein the compressor is adapted to compress the cooling fluid for return to the cooling fluid source to be resupplied to the cooling system. Such a cooling system may further comprise a heat exchanger fluidically connected between the compressor and the cooling fluid source and arranged to condition the cooling fluid temperature before it is returned to the cooling fluid source.

The cooling system according to the invention may have use cooling fluid that is any of $N_2O$, $CO_2$, ethylene or methylene.

In an embodiment, the drop in pressure effected by the reduction in cross-sectional area of the fluidic connection between the flow control unit and the cooling apparatus is approximately 50 bar (5 MPa).

In an embodiment, the cooling system may further comprise a heat exchanger fluidically connected between the cooling fluid source and the restriction and adapted to condition the cooling fluid to a desired temperature prior to expansion by the restriction.

In an embodiment, the present invention provides in a lithographic apparatus comprising a projection system configured to project a patterned radiation beam to form an exposure area on a substrate, the lithographic apparatus further comprising a cooling system according to the invention arranged to cool the substrate.

In an embodiment, the present invention provides in a lithographic apparatus comprising a projection system configured to project a patterned radiation beam to form an exposure area on a substrate;

a cooling apparatus located in use above the substrate adjacent to the exposure area, the cooling apparatus being configured to remove heat from the substrate during use;

a gas supply for supplying gas to an area above the substrate; and an aperture for receipt of a radiation beam wherein in use supplied gas and a received radiation beam react to form a plasma in the area above the substrate;

wherein the cooling apparatus has at least one surface comprising a material selected to increase a radical recombination probability. In an embodiment, the at least one surface comprises a structure comprising opposing surfaces to facilitate internal deflection of radicals. In an embodiment, the structure comprises a generally ribbed portion. In an embodiment, the structure comprises a generally honeycomb-like portion. In an embodiment, the at least one surface comprises a coating applied to at least part of the cooling apparatus. In an embodiment, such a coating is provided on at least one wall of the aperture for receipt of the radiation beam. In an embodiment, the at least one surface comprises any of Ni, Fe, Cr or Co, or a combination of any thereof. In an embodiment, the material of the cooling apparatus selected to increase the radical recombination probability has a high radical recombination probability of at least 10%.

In an embodiment, the present invention provides in a lithographic apparatus comprising a projection system configured to project a patterned radiation beam to form an exposure area on a substrate and a cooling apparatus, the cooling apparatus comprising:

a cooling element comprising a cooling surface, wherein in use the cooling element is located above the substrate adjacent to the exposure area, the cooling surface opposing the substrate;

a trapping agent delivery system, for providing a trapping agent to an area between the cooling surface and the substrate, wherein the trapping agent is configured to form a trapping layer on the cooling surface during use of the lithographic apparatus. In an embodiment, the trapping agent delivery system is configured to provide the trapping agent at a rate sufficient to cause the trapping layer to grow at a rate greater than a rate at which a contamination layer grows the cooling surface. In an embodiment, the cooling apparatus further comprises a cooling gas delivery conduit configured to deliver a cooling gas to the area between the cooling surface and the substrate. In an embodiment, the trapping agent delivery system is configured to provide the trapping agent as a vapour which condenses and/or freezes on the cooling surface. In an embodiment, the partial pressure of trapping agent in the area between the cooling surface and the substrate is less than the pressure of the cooling gas. In an embodiment, the cooling apparatus further comprises a thermal shield located between a first portion of the cooling element and the substrate, so as to reduce an amount of heat that is removed from the substrate by the first portion; and wherein the trapping agent delivery system is arranged to deliver the trapping agent in a solid, liquid and/or gas state to a portion of the thermal shield from which the trapping agent. In an embodiment, the trapping agent delivery system is arranged to provide the trapping agent in liquid form on the substrate. In an embodiment, the trapping agent delivery system is arranged to provide a precursor to an area adjacent the substrate, such that in use the precursor reacts with molecules present in the area adjacent the substrate to produce the trapping agent. In an embodiment, the cooling apparatus further comprises a modifying agent delivery system, wherein the modifying agent is configured to disorient the trapping layers the trapping layer forms on the cooling surface. In such embodiment, the cooling element may be configured to be cooled in use to a temperature above −110 degrees C. and modifying agent comprises ethanol. In an embodiment, a wetting promoting coating is provided on the cooling surface. In an embodiment, the trapping agent comprises $H_2O$. In an embodiment, the trapping layer comprises ice and/or a liquid $H_2O$ film. In an embodiment, the lithographic apparatus further comprises one or more heating elements disposed on or in the vicinity of the cooling surface and configured to selectively heat an area of the cooling surface.

In an embodiment of the present invention there is provided a lithographic apparatus comprising a projection system configured to project a patterned radiation beam to form an exposure area on a substrate and a cooling apparatus, the cooling apparatus comprising:

a cooling element comprising a cooling surface, wherein in use the cooling element is located above the substrate adjacent to the exposure area, the cooling surface opposing the substrate;

one or more heating elements disposed on or in the vicinity of the cooling surface and configured to selectively heat an area of the cooling surface.

In an embodiment of the present invention, there is provided a cooling system for cooling a substrate to be patterned by a lithographic apparatus, the cooling system comprising:

a cooling element for cooling the lithographic apparatus;

the cooling element comprising a cooling surface, wherein in use the cooling surface opposes a substrate to be patterned by the lithographic apparatus; and a trapping agent delivery system, for providing in use a trapping agent to an area between the cooling surface and the substrate, wherein the trapping agent is configured to form a trapping layer on the cooling surface during use of the lithographic apparatus.

In an embodiment of the present invention, there is provided a lithographic apparatus comprising a projection system configured to project a patterned radiation beam to form an exposure area on a substrate and a cooling apparatus, the cooling apparatus comprising:

a cooling element comprising a cooling surface, wherein in use the cooling element is located above the substrate adjacent the exposure area, the cooling surface opposing the substrate;

wherein the cooling apparatus further comprises at least one surface comprising a self-cleaning material. In an embodiment, the self-cleaning material comprises a catalytic material. In an embodiment, the self-cleaning material has a low affinity for hydrocarbons.

In an embodiment, the self-cleaning material catalyzes oxidation and/or reduction reactions, preferably wherein the oxidation and/or reduction reactions promote conversion of outgassing materials to more volatile materials. In an embodiment, the radiation beam has a focal plane and the apparatus comprises means for moving the substrate away from the focal plane. In an embodiment, the apparatus further comprises a source of active species, such as a plasma source or a hydrogen radical source. In such embodiment, the source of active species may be adapted to produce reactive hydrogenous species and/or reactive oxygenous species. In an embodiment, the apparatus comprises an oxidizing agent source. In an embodiment, the oxidizing agent comprises one of or a combination of oxygen, ozone, air, hydrogen peroxide, and water. In an embodiment, the self-cleaning material comprises one or more of rhodium ruthenium, palladium, platinum, silver, osmium, iridium, gold, nickel, titanium, zinc, zirconium, iron, cobalt, vanadium, copper, manganese, yttrium, cerium, gadolinium, hafnium, uranium, and/or oxides thereof.

In an embodiment, the present invention provides in a projection system configured to project a patterned radiation beam to form an exposure area on a substrate, a cooling apparatus comprising a cooling element comprising a cooling surface, wherein in use the cooling element is located above the substrate adjacent to the exposure area, the cooing surface opposing the substrate, wherein the cooling surface comprises a self-cleaning material.

In an embodiment, the present invention provides in a cooling system for cooling a substrate to be patterned by a lithographic apparatus, the cooling system comprising:

a cooling element for cooling the lithographic apparatus, the cooling element comprising a cooling surface, wherein in use the cooling surface opposes substrate to be patterned by the lithographic apparatus, wherein the cooling surface comprises a self-cleaning material.

In an embodiment, the present invention provides in a method of cleaning a cooling system of a lithographic apparatus, said method comprising providing at least one surface comprising a self-cleaning material. In an embodiment, an oxidizing agent is introduced into the lithographic apparatus constantly or periodically. In such embodiment, the oxidizing agent may comprise any of oxygen, air, water vapour, hydrogen peroxide, ozone, hydroxide radicals, oxygen radicals, or combinations thereof. In such embodiment, the oxidizing agent may be activated by any suitable means, including by absorption of electromagnetic radiation or by ionisation. In an embodiment, the oxidizing agent is generated away from the at least one surface comprising a self-cleaning material and introduced when the lithographic apparatus is not in use patterning wafers. In an embodiment, the oxidizing agent, preferably hydrogen peroxide, is provided on a non-imaging wafer, and the non-imaging wafer is passed through a radiation beam of the lithographic apparatus to promote release of the oxidizing agent in the vicinity of the at least one cooling surface.

In an embodiment, the present invention provides in the use of a non-imaging wafer comprising an oxidizing agent in the afore described methods.

In an embodiment, the present invention provides in a cooling apparatus for a lithographic apparatus, wherein at least one surface of said cooling apparatus is coated with a self-cleaning material.

In an embodiment, the present invention provides in a lithographic apparatus as described above, the apparatus further comprising a trapping agent delivery system, for providing a trapping agent to an area between a cooling surface of the cooling apparatus and the substrate, wherein the trapping agent is configured to form a trapping layer on the cooling surface during use of the lithographic apparatus.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A cooling system for use in a projection apparatus, the projection apparatus being configured to project a radiation beam to form an exposure area on a substrate, the cooling system comprising:
   a cooling apparatus located, in use, above the substrate adjacent to the exposure area, the cooling apparatus comprising a cooling surface and an outlet, the cooling surface being configured to remove heat from the substrate during use, the outlet being configured to deliver a cooling fluid, and the cooling surface and the outlet are configured to face the substrate during use; and
   a contamination control arrangement configured to control or remove contamination of a surface of the cooling apparatus.

2. The cooling system according to claim 1, wherein the contamination control arrangement comprises:
   a plasma vessel located below the cooling apparatus with its opening facing towards the cooling apparatus; and
   a gas supply for supplying gas to the plasma vessel and an aperture for receipt of a radiation beam,
   wherein, in use, supplied gas and a received radiation beam react to form a plasma within the plasma vessel that is directed towards a surface of the cooling apparatus which faces the opening of the plasma vessel.

3. The cooling system according to claim 2, wherein the plasma vessel comprises a reflector for reflecting radiation from the received radiation beam within the plasma vessel.

4. The cooling system according to claim 2, wherein the plasma vessel is configured to receive an additional flow of gas.

5. The cooling system according to claim 3, wherein the plasma vessel is configured to receive an additional flow of gas.

6. The cooling system according to claim 1, further comprising:
   a cooling fluid source for supplying the cooling fluid, the cooling apparatus being fluidically connected downstream of the cooling fluid source; and
   a restriction within the cross-sectional area of the fluidic connection between the cooling fluid source and the cooling apparatus, which restriction effects a reduction in pressure of the cooling fluid thereby to cause a local reduction in temperature in the vicinity of the cooling apparatus.

7. The cooling system according to claim 1, wherein the contamination control arrangement comprises:
   a gas supply for supplying gas to an area above the substrate; and
   an aperture for receipt of the radiation beam wherein in use supplied gas and a received radiation beam react to form a plasma in the area above the substrate;
   wherein the cooling apparatus has at least one surface comprising a material selected to increase a radical recombination probability.

8. The cooling system according to claim 1, wherein the contamination control arrangement comprises:
   a trapping agent delivery system, for providing a trapping agent to an area between the cooling surface and the substrate, wherein the trapping agent is configured to form a trapping layer on the cooling surface during use of the projection apparatus.

9. The cooling system according to claim 1, wherein the contamination control arrangement comprises:
   one or more heating elements disposed on or in the vicinity of the cooling surface and configured to selectively heat an area of the cooling surface.

10. The cooling system according to claim 1, wherein the contamination control arrangement comprises a self-cleaning material that is provided on the surface of the cooling apparatus.

11. The cooling system according to claim 1, wherein the contamination control arrangement comprises a non-sticking or low-sticking material that is provided on the surface of the cooling apparatus.

12. The cooling system according to claim 1, wherein the contamination control arrangement comprises a multilayer coating on the surface of the cooling apparatus, the multilayer coating including an outer layer of a non-sticking or low-sticking material.

13. The cooling system according to claim 1, wherein the contamination control arrangement comprises a DC voltage source connectable to the cooling apparatus.

14. The cooling system according to claim 1, wherein the contamination control arrangement comprises a gas source configured to, in use, supply a gas to an area between the cooling apparatus and the substrate and comprises a plasma generator for generating a plasma from the gas.

15. The cooling system according to claim 1, wherein the surface of the cooling apparatus is the cooling surface.

16. The cooling system according to claim 1, wherein the outlet comprises an opening in the cooling surface through which the cooling fluid is configured to pass such that, in use, the cooling fluid is delivered to a region between the cooling surface and the substrate.

17. The cooling system according to claim 16, wherein the contamination control arrangement comprises:
 a plasma vessel located below the cooling apparatus with its opening facing towards the cooling apparatus; and
 a gas supply for supplying gas to the plasma vessel and an aperture for receipt of a radiation beam,
 wherein, in use, supplied gas and a received radiation beam react to form a plasma within the plasma vessel that is directed towards the cooling surface of the cooling apparatus, and the cooling surface of the cooling apparatus faces the opening of the plasma vessel.

18. A lithographic apparatus comprising:
 a projection apparatus configured to project a radiation beam to form an exposure area on a substrate; and
 a cooling system comprising:
  a cooling apparatus located, in use, above the substrate adjacent to the exposure area, the cooling apparatus comprising a cooling surface and an outlet, the cooling surface being configured to remove heat from the substrate during use, the outlet being configured to deliver a cooling fluid, and the cooling surface and the outlet are configured to face the substrate during use; and
  a contamination control arrangement configured to control or remove contamination of a surface of the cooling apparatus.

19. The lithographic apparatus according to claim 18, wherein the surface of the cooling apparatus is the cooling surface.

20. A cooling system for use in a projection apparatus, the projection apparatus being configured to project a radiation beam to form an exposure area on a substrate, the cooling system comprising:
 a cooling apparatus located, in use, above the substrate adjacent to the exposure area, the cooling apparatus being configured to remove heat from the substrate during use; and
 a contamination control arrangement configured to control or remove contamination of a surface of the cooling apparatus, wherein the contamination control arrangement comprises:
 a gas supply for supplying gas to an area above the substrate; and
 an aperture for receipt of the radiation beam wherein in use supplied gas and a received radiation beam react to form a plasma in the area above the substrate;
 wherein the cooling apparatus has at least one surface comprising a material selected to increase a radical recombination probability.

* * * * *